(12) United States Patent
Otsuki

(10) Patent No.: US 9,474,180 B2
(45) Date of Patent: Oct. 18, 2016

(54) METHOD OF MANUFACTURING ELECTRONIC DEVICE AND ELECTRONIC DEVICE

(71) Applicant: SEIKO EPSON CORPORATION, Tokyo (JP)

(72) Inventor: Tetsuya Otsuki, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 411 days.

(21) Appl. No.: 13/962,428

(22) Filed: Aug. 8, 2013

(65) Prior Publication Data

US 2013/0322046 A1   Dec. 5, 2013

Related U.S. Application Data

(62) Division of application No. 12/786,778, filed on May 25, 2010, now Pat. No. 8,537,567.

(30) Foreign Application Priority Data

May 28, 2009 (JP) ................................ 2009-128603

(51) Int. Cl.
  *H05K 5/02* (2006.01)
  *H05K 7/14* (2006.01)
  *H01L 23/495* (2006.01)
  *H01L 23/00* (2006.01)

(52) U.S. Cl.
  CPC ........... *H05K 7/14* (2013.01); *H01L 23/49537* (2013.01); *H01L 23/49551* (2013.01); *H01L 23/49555* (2013.01); *H01L 23/49575* (2013.01); *H01L 24/16* (2013.01); *H01L 24/32* (2013.01); *H01L 24/33* (2013.01); *H01L 24/45* (2013.01); *H01L 24/48* (2013.01); *H01L 24/49* (2013.01); *H01L 2224/0557* (2013.01); *H01L 2224/05573* (2013.01); *H01L 2224/16225* (2013.01); *H01L 2224/32225* (2013.01); *H01L 2224/45144* (2013.01); *H01L 2224/4809* (2013.01); *H01L 2224/48095* (2013.01); *H01L 2224/48105* (2013.01); *H01L 2224/48227* (2013.01);
(Continued)

(58) Field of Classification Search
  CPC .............. H05K 7/14; H01L 23/49537; H01L 23/49551; H01L 23/49555; H01L 24/16; H01L 24/32
  USPC ......................................................... 361/813
  See application file for complete search history.

(56) References Cited

U.S. PATENT DOCUMENTS 5,497,032 A   3/1996   Tsuji et al.
5,804,468 A   9/1998   Tsuji et al.
(Continued)

FOREIGN PATENT DOCUMENTS

JP   A-7-231069   8/1995
JP   A-8-31998    2/1996
(Continued)

*Primary Examiner* — Tremesha S Willis
(74) *Attorney, Agent, or Firm* — Oliff PLC

(57) ABSTRACT

A method of manufacturing an electronic device, the method includes: preparing a first lead frame having a first lead, the first lead having a first portion located in a first region; electrically connecting the first lead and a first electronic part; bending the first lead such that the first portion is located outside the first region; arranging a second lead frame to overlap the first lead frame such that a second portion of a second lead of the second lead frame is located in the first region; and electrically connecting the second lead and the second electronic part.

8 Claims, 24 Drawing Sheets

(52) U.S. Cl.
CPC .......... *H01L2224/48247* (2013.01); *H01L 2224/48465* (2013.01); *H01L 2224/49171* (2013.01); *H01L 2224/73204* (2013.01); *H01L 2924/01029* (2013.01); *H01L 2924/01079* (2013.01); *H01L 2924/12041* (2013.01); *H01L 2924/14* (2013.01); *H01L 2924/181* (2013.01); *H01L 2924/19041* (2013.01); *H01L 2924/19043* (2013.01); *H01L 2924/3025* (2013.01); *Y10T 29/49117* (2015.01)

(56) References Cited

U.S. PATENT DOCUMENTS 6,080,999 A * 6/2000 Mizuuchi ............ H01L 31/0203
257/666

| 6,396,130 | B1 | 5/2002 | Crowley et al. |
| 7,291,905 | B2 | 11/2007 | Hirasawa et al. |
| 2002/0020906 | A1 | 2/2002 | Hirasawa et al. |
| 2007/0170228 | A1 | 7/2007 | Zhao et al. |
| 2008/0158846 | A1 | 7/2008 | Martin |

FOREIGN PATENT DOCUMENTS

| JP | A-11-087781 | 3/1999 |
| JP | A-2002-057365 | 2/2002 |
| JP | A-2007-194623 | 8/2007 |
| JP | A-2008-051628 | 3/2008 |

* cited by examiner

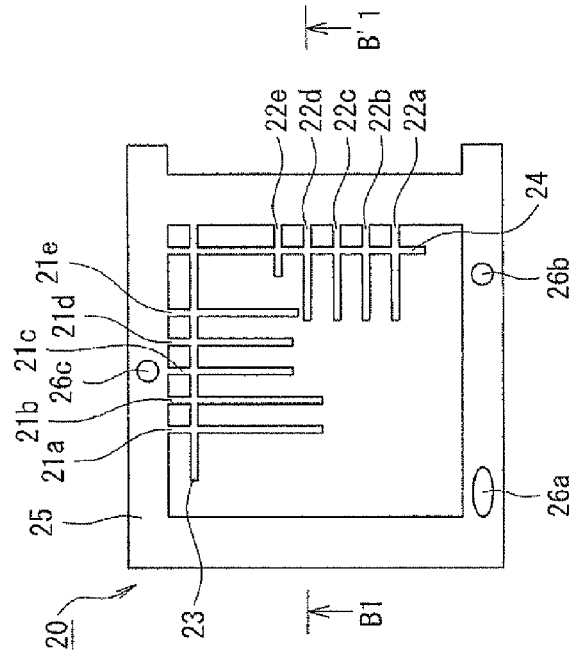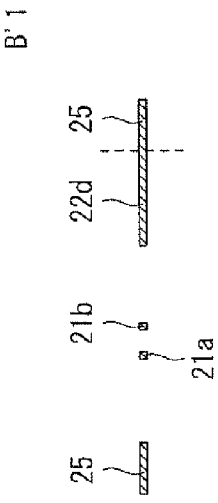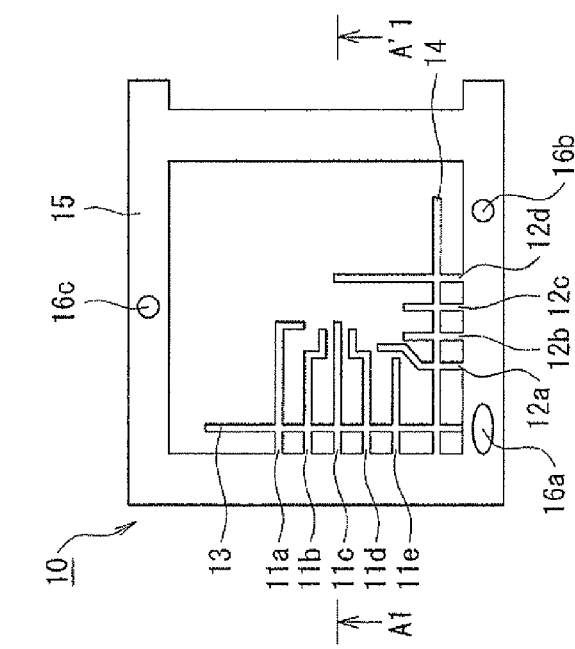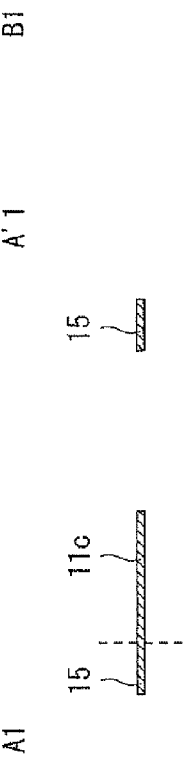
FIG. 1A
FIG. 1B
FIG. 1C
FIG. 1D

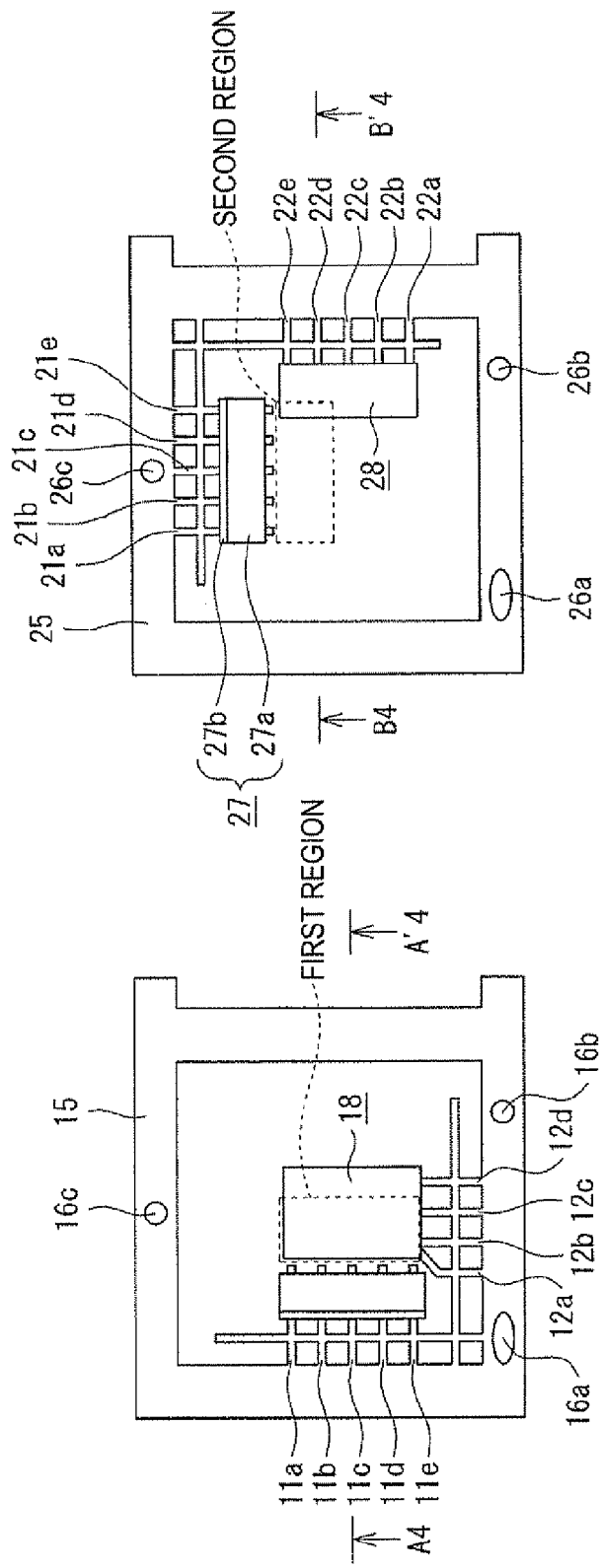
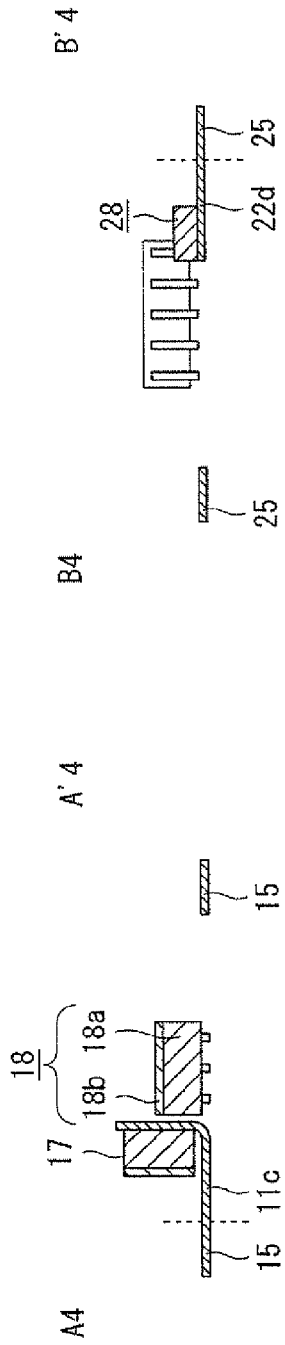
FIG. 4A, FIG. 4B, FIG. 4C, FIG. 4D

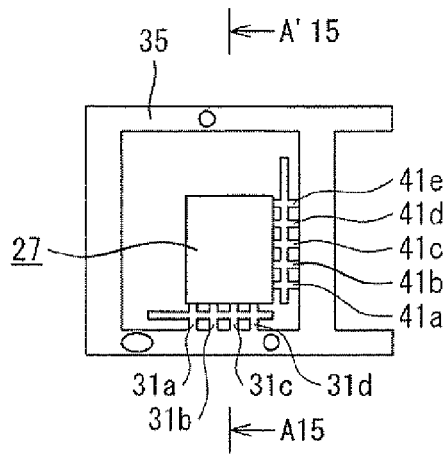
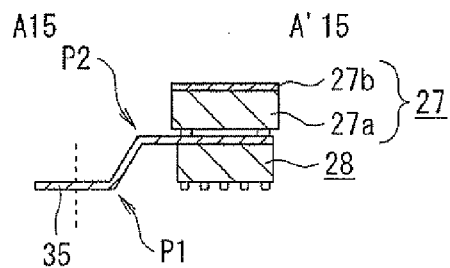
FIG.15A  FIG.15B
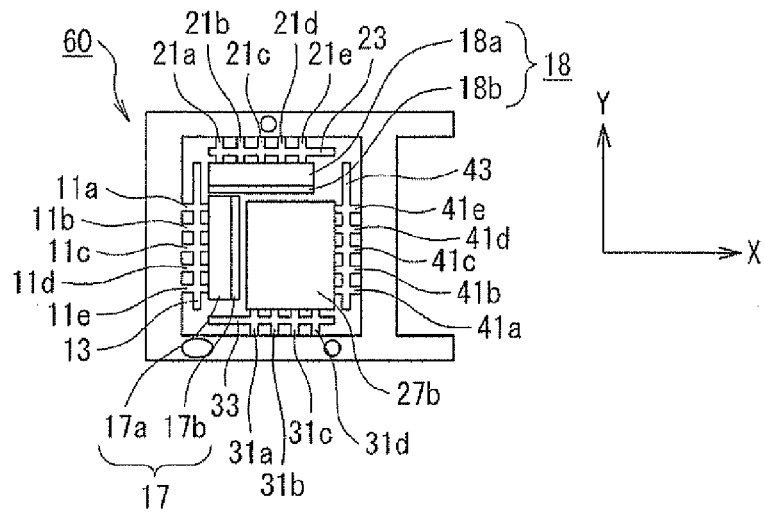
FIG.16
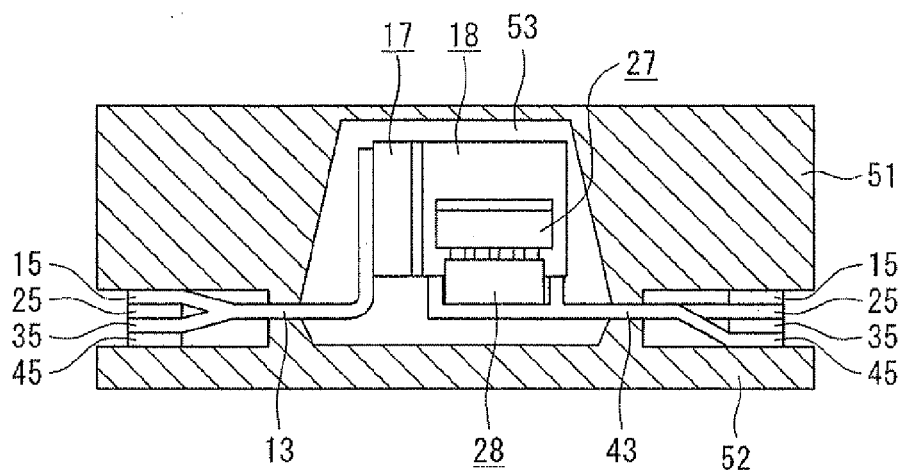
FIG.17

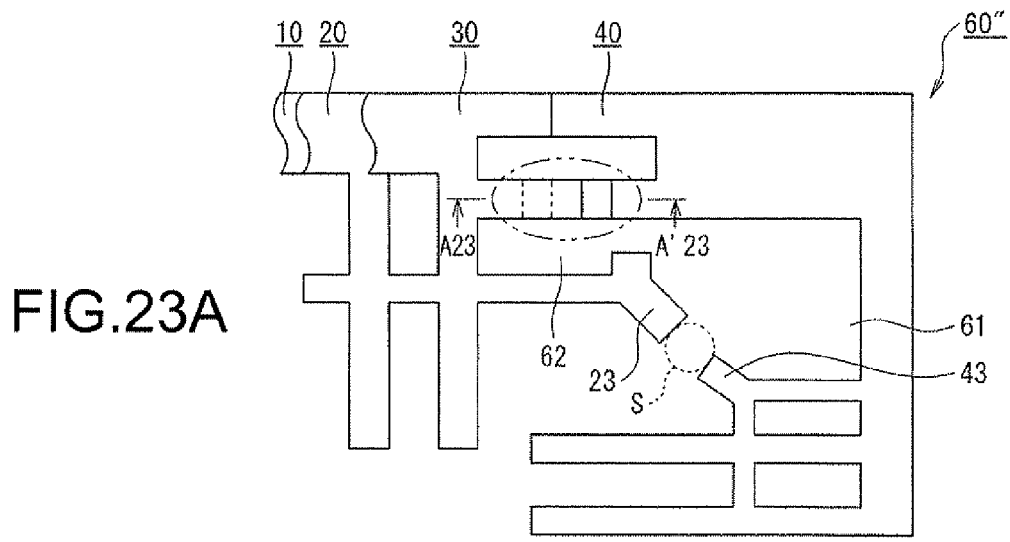

METHOD OF MANUFACTURING ELECTRONIC DEVICE AND ELECTRONIC DEVICE

This is a Division of application Ser. No. 12/786,778 filed May 25, 2010. The disclosure of the prior applications is hereby incorporated by reference herein in its entirety. The entire disclosure of Japanese Patent Application No. 2009-128603, filed May 28, 2009 is expressly incorporated by reference herein.

BACKGROUND

1. Technical Field

The present invention relates to a method of manufacturing an electronic device and an electronic device.

2. Related Art

A lead frame is used as a metal plate which supports an IC (Integrated Circuit) element inside an electronic device and leads a plurality of terminals of the semiconductor element to the outside of a resin package.

FIGS. 24A to 25B are process views showing a method of manufacturing an electronic device according to the related art. FIGS. 24A to 25A are plan views, and FIG. 25B is a sectional view taken along the arrow of FIG. 25A. In FIG. 25A, to avoid complexity of the drawing, an upper mold 141 (see FIG. 25B) is not shown.

As shown in FIG. 24A, first, a lead frame 110 is prepared. The lead frame 110 has a die pad 111 for fixing an electronic part, a plurality of leads 112 for leading the respective terminals of an electronic part fixed onto the die pad 111 to the outside, and a dam bar 113 for connecting a plurality of leads 112. The dam bar 113 has a frame shape conforming to the outer edge of the resin package in plan view. The dam bar 113 prevents mold resin from spreading outside the frame when the electronic part is sealed with resin. In the lead frame 110, the die pad 111, a plurality of leads 112, and the dam bar 113 are formed integrally of a single copper plate.

Next, as shown in FIG. 24B, an electronic part 121 is attached onto the die pad 111 of the lead frame 110. The respective terminals of the electronic part 121 and the leads 112 are connected to each other by using, for example, gold wires 131 or the like. Next, as shown in FIGS. 25A and 25B, the electronic part 121 fixed onto the die pad 111 is arranged between an upper mold 141 and a lower mold 142, and both molds are clamped so as to sandwich the dam bar 113 therebetween from above and below, so that a cavity 143 is formed. The mold resin is injected into the cavity 143 and hardened. Thus, a resin package is formed, and the electronic part 121 is sealed in the resin package. Thereafter, the cavity 143 is opened, the resin package is extracted, and the dam bar 113 outside the resin package is cut to respectively separate a plurality of leads 112. In such a manner, an electronic device is completed.

Other examples of the related art are JP-A-7-231069 and JP-A-8-31998.

That is, JP-A-7-231069 describes a method which divides a stage portion, on which an electronic part is mounted, into a plurality of areas, and, for example, respectively uses first to third areas as an element mounting area, a ground layer, and a power supply layer. According to the method described in JP-A-7-231069, a stage-portion frame having the first to third areas and a lead-portion frame having a predetermined number of leads are provided separately and arranged to overlap each other.

JP-A-8-31998 describes a structure in which a pair of leads in a sealed body (package) are bent halfway and extend obliquely upward, a semiconductor chip is fixed at the lower surface of one lead extending obliquely upward, one end of a wire is connected to the lower surface of the other lead, and the other end of the wire is connected to an electrode of the semiconductor chip.

According to the related art shown in FIGS. 24A to 25B, for example, as shown in FIG. 26A, when two electronic parts 121 and 122 are arranged in one resin package, the two electronic parts 121 and 122 may be arranged in parallel on the die pad 111. However, as shown in FIG. 26B, when the electronic parts 121 and 122 are larger than the die pad 111, portions of the electronic parts 121 and 122 overlap each other in plan view and come into contact with each other (that is, interfere with each other).

To avoid such a situation, according to the related art, it is necessary to increase the area of the die pad 111 in accordance with the number of electronic parts 121 and 122 or the size of the electronic parts 121 and 122, resulting in a significant increase in the size of the resin package.

The technique described in JP-A-7-231069 cannot eliminate such a problem. In addition, JP-A-8-31998 has not supposed that a plurality of electronic devices are arranged in a single resin package.

SUMMARY

An advantage of some aspects of the invention is that it provides a method of manufacturing an electronic device capable of suppressing an increase in the size of a resin package even when a plurality of electronic parts are arranged in a single resin package, and an electronic device.

An aspect of the invention provides a method of manufacturing an electronic device. The method includes preparing a first lead frame having a first lead, the first lead having a first portion located in a first region, electrically connecting the first lead and a first electronic part, bending the first lead such that the first portion is located outside the first region, arranging a second lead frame to overlap the first lead frame such that a second portion of a second lead of the second lead frame is located in the first region, and electrically connecting the second lead and a second electronic part.

With this method, the second lead frame is arranged to overlap the first lead frame, so that a single lead frame can be formed. Thus, the first electronic part and the second electronic part can be arranged three-dimensionally in the single lead frame. That is, a plurality of electronic parts can be arranged densely in a single lead frame by changing the height or angle of the mounting surfaces of the electronic parts. For this reason, even when a plurality of electronic parts are arranged in a single resin package, an increase in the size of the resin package can be suppressed.

The method may further include preparing a third lead frame having a third lead, the third lead having a third portion located in a second region, electrically connecting the third lead and a third electronic part, bending the third lead such that the third portion is located outside the second region, arranging the third lead frame to overlap the second lead frame such that the second portion of the second lead is located in the second region, and arranging the third lead frame to overlap the first lead frame.

With this method, the first to third electronic parts can be arranged three-dimensionally so as not to come into contact with each other. Therefore, for example, even when three or more electronic parts are arranged in a single resin package, an increase in the size of the resin package can be suppressed.

The method may further include bending the third lead such that the third portion of the third lead is located above an upper side of the second portion of the second lead or below a lower side of the second portion of the second lead in sectional view. With this method, for example, the third electronic part and the second electronic part can be arranged in a stacked manner.

In the arranging of the second lead frame to overlap the first lead frame, a first dam bar of the first lead frame and a second dam bar of the second lead frame may form at least a portion of a frame which surrounds the first electronic part and the second electronic part in plan view. The method may further include injecting resin into a region surrounded by the frame to seal the first electronic part and the second electronic part. A clearance may be provided in the frame. With this method, resin can be injected into the frame from the outside or air can be discharged from the inside of the frame to the outside by using the clearance provided in the frame. Therefore, resin sealing can be stably carried out.

Another aspect of the invention provides a method of manufacturing an electronic device. The method includes preparing a first lead frame having a first lead, the first lead having a first portion located in a first region, and a second lead frame having a second lead and a second electronic part placed at a second portion of the second lead, placing a first electronic part on a first side of the first portion, bending the first lead at multiple points, and after the bending of the first lead, arranging the first lead frame and the second lead frame to overlap each other such that the second portion of the second lead is located in the first region. In the bending of the first lead at multiple points, the first lead is bent such that the first portion after the bending of the first lead at multiple points is located further on the first side or a second side opposite to the first side than the first portion before the bending of the first lead at multiple points.

With this method, the second lead frame is arranged to overlap the first lead frame, so that a single lead frame can be formed. Thus, for example, the first electronic part and the second electronic part can be arranged in the single lead frame in a stacked manner. A plurality of electronic parts can be arranged in a single resin package by changing the height of the mounting surfaces of the electronic parts, so that an increase in the size of the resin package can be suppressed.

Yet another aspect of the invention provides a method of manufacturing an electronic device. The method includes preparing a lead frame having a first lead and a second lead, the first lead having a first portion located in a first region and the second lead having a second portion located in the first region, placing a first electronic part at the first portion, bending the first lead such that the first portion is located outside the first region, and placing a second electronic part at the second portion.

With this method, the first electronic part and the second electronic part can be arranged three-dimensionally by using a single lead frame. That is, a plurality of electronic parts can be arranged densely in the single lead frame by changing the height or angle of the mounting surfaces of the electronic parts. For this reason, even when a plurality of electronic parts are arranged in a single resin package, an increase in the size of the resin package can be suppressed.

According to still yet another aspect of the invention, an electronic device includes a first lead frame having a first lead bent at a first point, a second lead frame having a second lead, a first electronic part mounted at a first portion between the first point and a front end of the first lead, and a second electronic part mounted at a second portion of the second lead. The second lead frame is arranged to overlap the first lead frame, and a first distance from the first point to the second electronic part is shorter than a second distance from the first point to the front end of the first lead.

With this configuration, the first lead frame and the second lead frame form a single lead frame, and the first electronic part and the second electronic part are arranged three-dimensionally in the single lead frame. A plurality of electronic parts are arranged densely by using a space in the height direction, so that an increase in the size of a resin package can be suppressed.

According to further another aspect of the invention, an electronic device includes a lead frame having a first lead bent at a first point and a second lead, a first electronic part mounted at a first portion between the first point and a front end of the first lead, and a second electronic part mounted at a second portion of the second lead. A first distance from the first point to the second electronic part is shorter than a second distance from the first point to the front end of the first lead.

With this configuration, the first electronic part and the second electronic part are arranged three-dimensionally in a single lead frame. A plurality of electronic parts are arranged densely by using a space in the height direction, so that an increase in the size of a resin package can be suppressed.

BRIEF DESCRIPTION OF THE DRAWINGS

The invention will be described with reference to the accompanying drawings, wherein like numbers reference like elements.

FIGS. 1A to 1D are diagrams showing a method of manufacturing an electronic device according to a first embodiment of the invention.

FIGS. 4A to 4D are diagrams showing the method of manufacturing an electronic device according to the first embodiment of the invention.

FIGS. 15A and 15B are diagrams showing the method of manufacturing an electronic device according to the third embodiment of the invention.

FIG. 16 is a diagram showing the method of manufacturing an electronic device according to the third embodiment of the invention.

FIG. 17 is a diagram showing the method of manufacturing an electronic device according to the third embodiment of the invention.

FIGS. 23A to 23C are diagrams showing another configuration example of a lead frame according to the fifth embodiment of the invention.

DESCRIPTION OF EXEMPLARY EMBODIMENTS

Figure 2A:
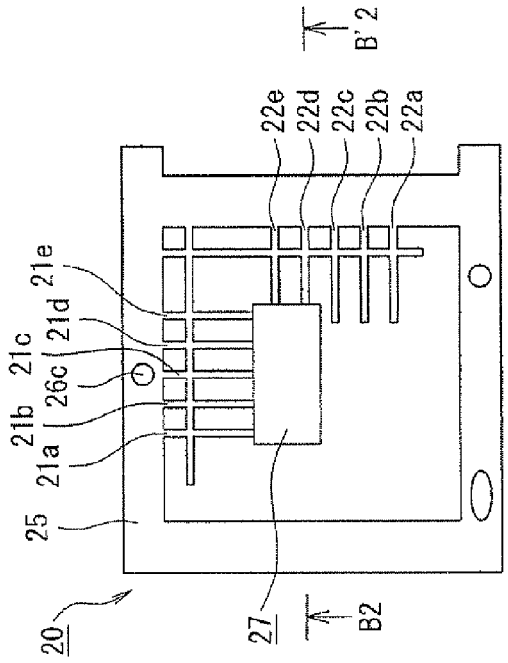
FIGS. 2A to 2D are diagrams showing the method of manufacturing an electronic device according to the first embodiment of the invention.

Hereinafter, embodiments of the invention will be described with reference to the drawings. In the respective drawings, the parts having the same configuration are represented by the same reference numerals, and overlap description will be omitted.

(1) First Embodiment

FIGS. 1A to 7B are diagrams showing a method of manufacturing an electronic device according to a first embodiment of the invention. In FIG. 6A, to avoid complexity of the drawing, an upper mold is not shown.

In the first embodiment, two divided lead frames are prepared and arranged to overlap each other after partially bending respective leads of the divided lead frames, so that a single lead frame is formed. Thereafter, a plurality of electronic parts mounted on the respective leads of the lead frame are collectively sealed with resin. Thus, an electronic device is completed in which a plurality of electronic parts are arranged in a single resin package. This will be described below in detail.

As shown in FIGS. 1A to 1D, first, two divided lead frames 10 and 20 are prepared. As shown in FIGS. 1A and 1C, the divided lead frame 10 has, for example, a plurality of leads 11a to 11e and 12a to 12d, dam bars 13 and 14, and a support frame 15.

Of these, the leads 11a to 11e and 12a to 12d are used as stages on which electronic parts are mounted, and are also used as external connection terminals (that is, terminals which are connected to the outside and used to transmit and receive signals or power). The dam bars 13 and 14 stop the flow of mold resin when the respective electronic parts mounted on the leads 11a to 11e and 12a to 12d are sealed with resin (for example, mold resin) so as to prevent the mold resin from spreading to outside of the dam bars. The dam bar 13 connects the leads 11a to 11e to each other, and the dam bar 14 connects the leads 12a to 12d to each other. The support frame 15 is an external frame of the divided lead frame 10 and supports the leads 11a to 11e and 12a to 12d and the dam bars 13 and 14. The support frame 15 is provided with through holes 16a to 16c which are used to position the divided lead frames when the divided lead frames are arranged to overlap each other in a subsequent step. The divided lead frame 10 is formed by, for example, etching a single copper plate or punching the copper plate with a mold, so that the leads 11a to 11e and 12a to 12d, the dam bars 13 and 14, and the support frame 15 are formed as a single body.

As shown in FIGS. 1B and 1D, similarly to the divided lead frame 10, the divided lead frame 20 has, for example, a plurality of leads 21a to 21e and 22a to 22e, dam bars 23 and 24, and a support frame 25. Of these, the dam bar 23 connects the leads 21a to 21e to each other, and the dam bar 24 connects the leads 22a to 22e to each other. The support frame 25 is provided with through holes 26a to 26c which are used to position the divided lead frames when the divided lead frames are arranged to overlap each other in a subsequent step. The divided lead frame 20 is formed by etching a single copper plate or punching the copper plate with a mold, so that the leads 21a to 21e and 22a to 22d, the dam bars 23 and 24, and the support frame 25 are formed as a single body.

In comparison of FIGS. 1A and 1C with FIGS. 1B and 1D, it can be seen that the support frame 15 of the divided lead frame 10 and the support frame 25 of the divided lead frame 20 have the same shape and size. The through holes 16a to 16c and 26a to 26c are formed at the same positions of the support frames 15 and 25 to have the same shape and size. That is, if the divided lead frame 20 is arranged to overlap the divided lead frame 10, the positions of the through holes 16a to 16c respectively match the positions of the through holes 26a to 26c.

Figure 2B:
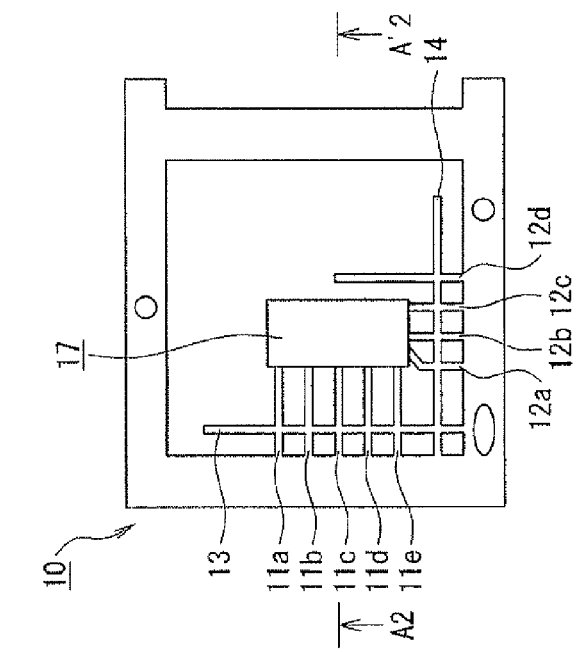
Figure 2C:
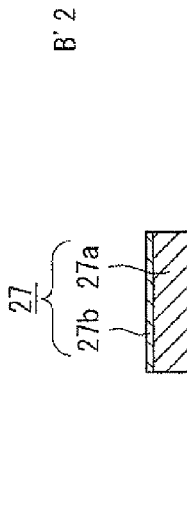

Next, as shown in FIGS. 2A and 2C, an electronic part 17 is attached onto the leads 11a to 11e of the divided lead frame 10, and the terminals of the electronic part 17 and the leads 11a to 11e are electrically connected to each other, respectively. The electronic part 17 is, for example, a gyro sensor which is a kind of semiconductor element (that is, a device which uses quartz crystal as an element and detects an angular velocity). When the electronic part 17 is a gyro sensor, for example, a cavity is provided in a resin package 17a, and an element, such as quartz crystal, is arranged in the cavity. A metal cap 17b is attached closely to the upper surface of the resin package 17a. The metal cap 17b allows the cavity in the resin package 17a to be maintained in a vacuum state.

Figure 2D:
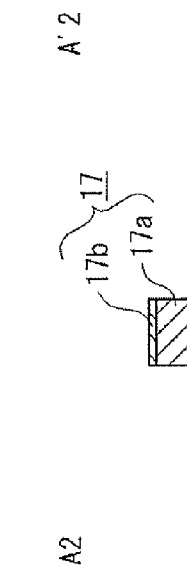

Similarly, as shown in FIGS. 2B and 2D, an electronic part 27 is attached onto the leads 21a to 21e of the divided lead frame 20, and the terminals of the electronic part 27 and the leads 21a to 21e are electrically connected to each other, respectively. The electronic part 27 is, for example, a gyro sensor, and has a resin package 27a and a metal cap 27b.

Hereinafter, for convenience of description, the terms "first region", "second region", and "third region" are used. In the first, second, and third embodiments, the first region refers to at least a portion of a region where the electronic part 17 is initially arranged on the leads 11a to 11e (that is, an original arrangement region). In other words, the first region refers to at least a portion of a region where the electronic part 17 is arranged on the leads 11a to 11e before a step described below of bending the portions of the leads 11a to 11e to which the electronic part 17 is attached. In a fourth embodiment, the first region refers to at least a portion of a region where the electronic part 17 is initially arranged on the leads 11a to 11c (that is, an original arrangement region).

In the first embodiment, the second region refers to at least a portion of a region where the electronic part 27 is initially arranged on the leads 21a to 21e (that is, an original arrangement region). In other words, the second region refers to at least a portion of a region where the electronic part 27 is arranged on the leads 21a to 21e before a step described below of bending the portions of the leads 21a to 21e to which the electronic part 27 is attached. In a third embodiment, the second region refers to at least a portion of a region (original arrangement region) where an electronic part 27 is initially arranged on leads 31a to 31d.

The term "third region" is used in a third embodiment described below. The third region refers to at least a portion of a region where an electronic part 18 is initially arranged on the leads 21a to 21e (original arrangement region). In other words, the third region refers to at least a portion of a region where the electronic part 18 is arranged on the leads 21a to 21e before a step described below of bending the portions of the leads 21a to 21e to which the electronic part 18 is attached.

Figures 3A, 3B, 3C, 3D:
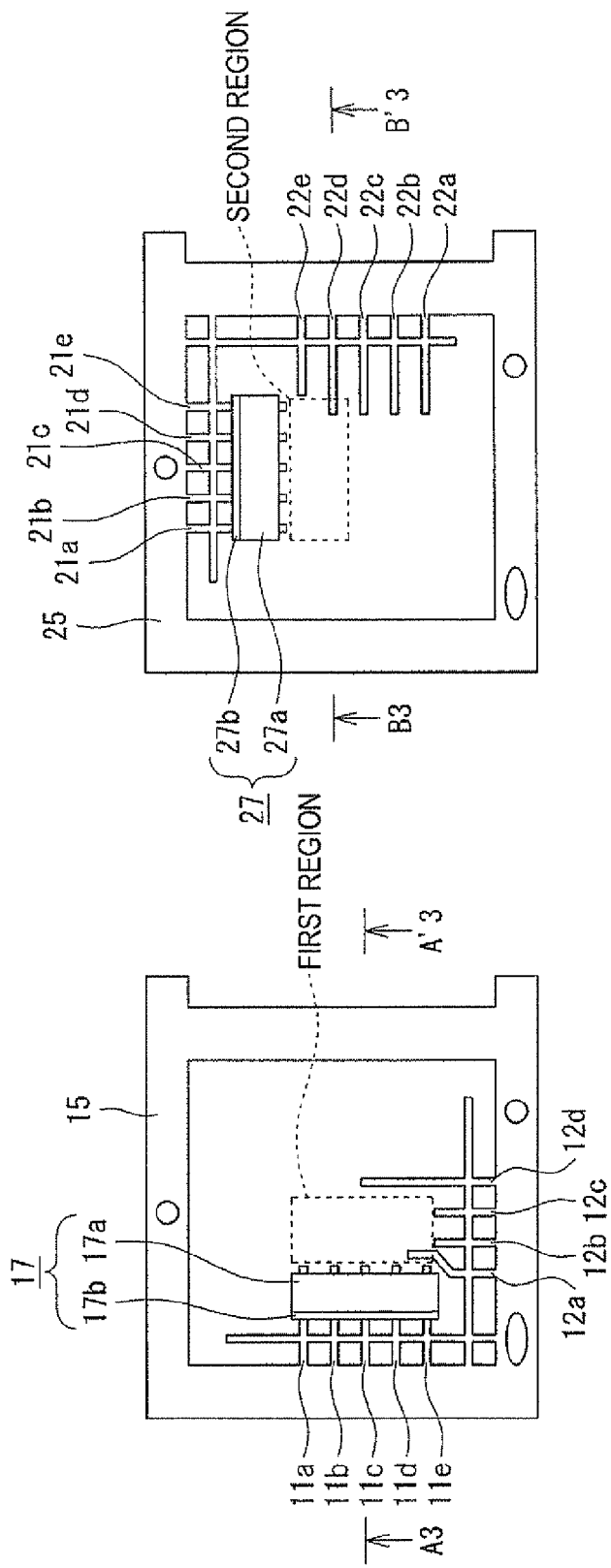
FIGS. 3A to 3D are diagrams showing the method of manufacturing an electronic device according to the first embodiment of the invention.

Next, as shown in FIGS. 3A and 3C, the leads 11a to 11e are bent such that the electronic part 17 and the portions (that is, attached portions) of the leads 11a to 11e to which the electronic part 17 is attached are located outside the first region. That is, the leads 11a to 11e are bent at a point P halfway toward the respective front ends thereof, so that the electronic part 17 and the attached portions of the leads 11a to 11e are moved outside the first region. For example, the leads 11a to 11e are bent at the point P upward at an angle of 90° in sectional view. At this time, a force may be applied to the attached portions of the leads 11a to 11e upward from below by using a mold or the like so as to bend the leads 11a to 11e. At the time of bending, a first mold or the like may be arranged on the point P of the leads 11a to 11e, and a force may be applied to the attached portions of the leads 11a to 11e upward from below by using a second mold or the like so as to bend the leads 11a to 11e.

Similarly, as shown in FIGS. 3B and 3D, the leads 21a to 21e are bent such that the electronic part 27 and the attached portions of the leads 21a to 21e to which the electronic part 27 is attached are located outside the second region. For example, the leads 21a to 21e are bent upward at an angle of 90° in sectional view. At this time, a force may be applied to the attached portions of the leads 21a to 21e upward from below by using, for example, a mold or the like so as to bend the leads 11a to 11e. The leads 21a to 21e may be bent in the same manner as the leads 11a to 11e.

Next, as shown in FIGS. 4A and 4C, the electronic part 18 is attached onto the leads 12a to 12d of the divided lead frame 10. The electronic part 18 is, for example, a gyro sensor, and has a resin package 18a and a metal cap 18b.

In the first embodiment, as described above, after the leads 11a to 11e are bent, the electronic part 18 is attached onto the leads 12a to 12d. At this time, at least portions of the electronic part 18 and the attached portions of the leads 12a to 12d are located in the first region. Meanwhile, the leads 11a to 11e are already bent, and the electronic part 17 and the attached portions of the leads 11a to 11e are located outside the first region, so that the electronic parts 17 and 18 or the leads 11a to 11e and 12a to 12d can be prevented from coming into contact with each other (that is, interfering with each other).

Similarly, as shown in FIGS. 4B and 4D, an electronic part 28 is attached onto the leads 22a to 22e of the divided lead frame 20. The electronic part 28 is, for example, an acceleration sensor which is a kind of semiconductor element (that is, a device which detects acceleration in at least one direction of the front, rear, left, right, and height directions). When the electronic part 28 is attached onto the leads 22a to 22e, at least portions of the electronic part 28 and the attached portions of the leads 22a to 22e are located in the second region. Meanwhile, the leads 21a to 21e are already bent, and the electronic part 27 and the attached portions of the leads 21a to 21e are located outside the second region, so that the electronic parts 27 and 28 or the leads 21a to 21e and 22a to 22e are prevented from coming into contact with each other.

Figure 5A:
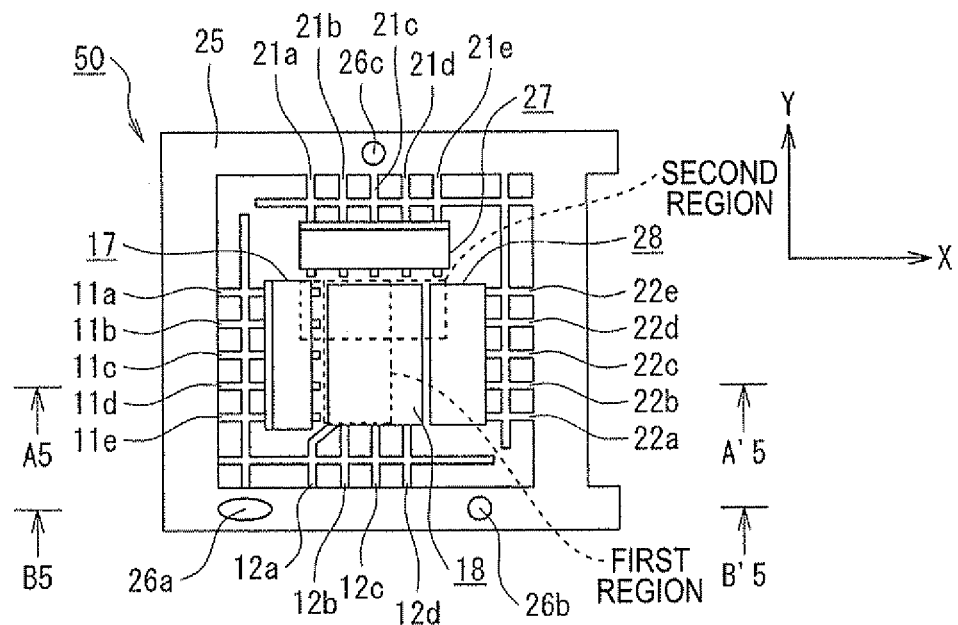
FIGS. 5A to 5C are diagrams showing the method of manufacturing an electronic device according to the first embodiment of the invention.
Figure 5B:
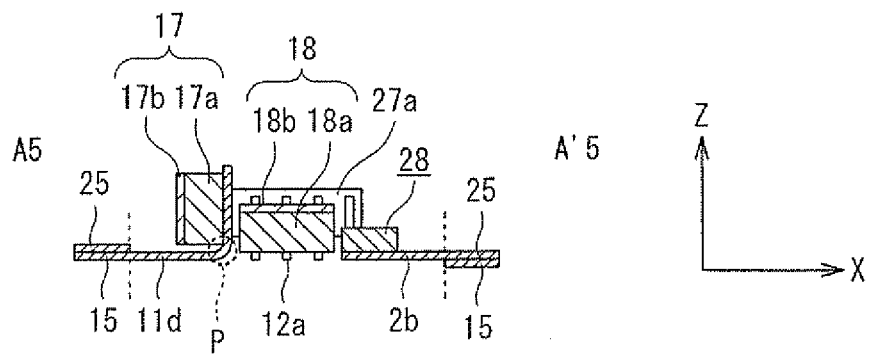

Next, as shown in FIGS. 5A and 5B, the divided lead frame 20 is arranged to overlap the divided lead frame 10, so that a single lead frame 50 is formed. In this case, the divided lead frame 10 and the divided lead frame 20 may be arranged to overlap each other such that the divided lead frame 20 is located above the upper side of the divided lead frame 10 or such that the divided lead frame 20 is located below the lower side of the divided lead frame 10.

Figure 5C:
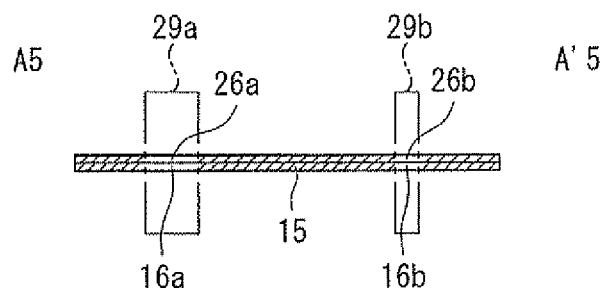

In positioning the divided lead frames 10 and 20, the through holes 16a to 16c and 26a to 26c may be used. For example, as shown in FIG. 5C, the through hole 26a is arranged to overlap the through hole 16a, and the through hole 26b is arranged to overlap the through hole 16b. Instead of (or in addition to) one of the overlapping of the through holes 16a and 26a and the overlapping of the through holes 16b and 26b, the through hole 26c is arranged to overlap the through hole 16c. For example, the through holes are aligned with each other at two places of the three places, so that the divided lead frames 10 and 20 can be positioned with good accuracy and high reproducibility.

As shown in FIG. 5C, after positioning, for example, a pin 29a may be inserted into the through holes 16a and 26a, and a pin 29b may be inserted into the through holes 16b and 26b. Thus, the state where the divided lead frames 10 and 20 are positioned can be maintained until a subsequent step (for example, a resin sealing step) is carried out.

As shown in FIGS. 5A and 5B, the electronic parts 17, 18, 27, and 28 are arranged three-dimensionally to be separated from each other in the single lead frame 50. The metal cap 17b of the electronic part 17 is directed in the left-right direction (hereinafter, referred to as x-axis direction) in plan view, the metal cap 27b of the electronic part 27 is directed in the up-down direction (hereinafter, referred to as Y-axis direction) in plan view, and the metal cap 18b of the electronic part 18 is directed in the up-down direction, that is, the height direction (hereinafter, referred to as Z-axis direction) in sectional view.

For this reason, the electronic part 17 can be used as a gyro sensor in the X-axis direction, the electronic part 27 can be used as a gyro sensor in the Y-axis direction, and the electronic part 18 can be used as a gyro sensor in the Z-axis direction. An orthogonal coordinate system having the x axis, the Y axis, and the Z axis of the respective gyro sensors can be formed in a signal package.

Figure 6A:
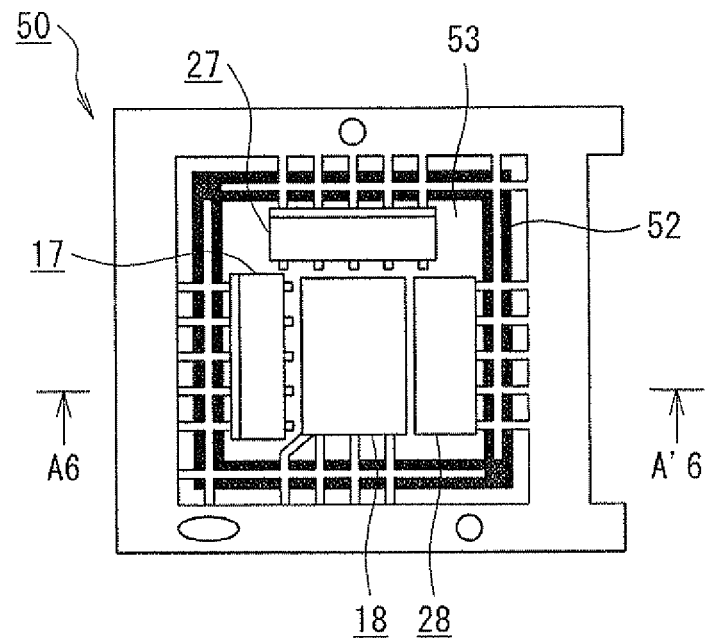
FIGS. 6A and 6B are diagrams showing the method of manufacturing an electronic device according to the first embodiment of the invention.
Figure 6B:
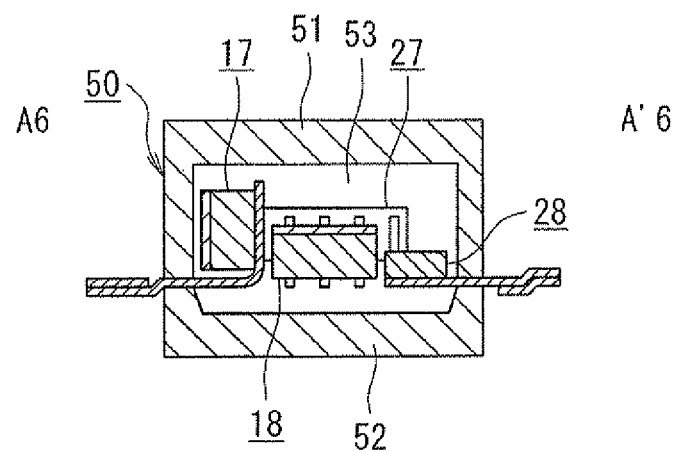

Next, as shown in FIGS. 6A and 6B, the lead frame 50 in which the electronic parts 17, 18, 27, and 28 are arranged three-dimensionally is arranged between an upper mold 51 and a lower mold 52, and both molds are clamped so as to sandwich the dam bars 13, 14, 23, and 24 therebetween from above and below to form a cavity 53. Then, for example, mold resin is injected into the cavity 53 and hardened.

Figure 7A:
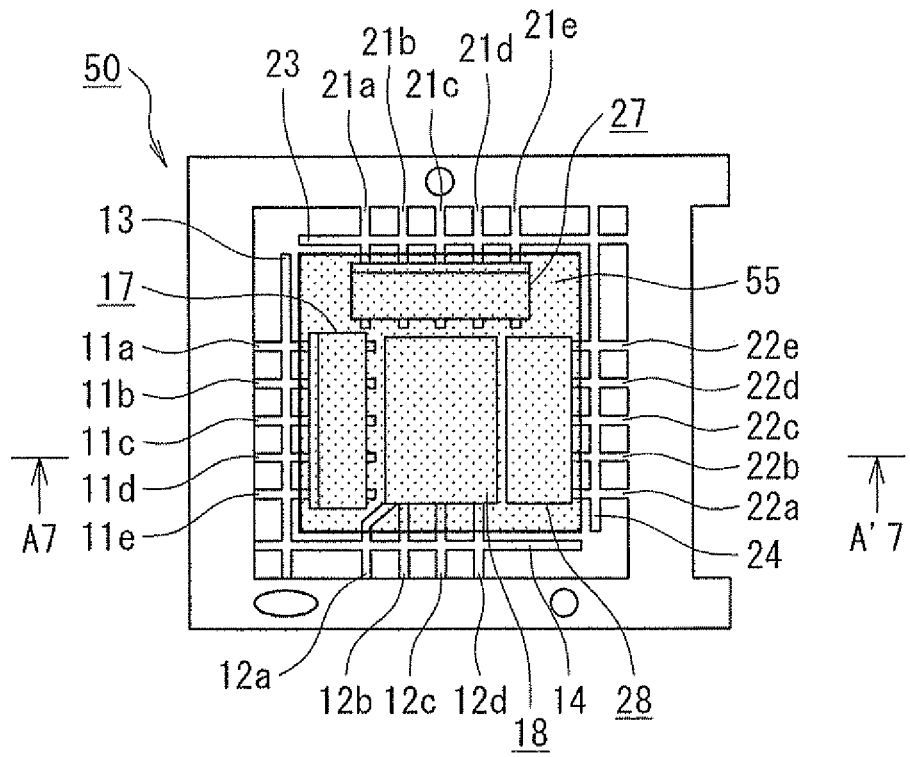
FIGS. 7A and 7B are diagrams showing the method of manufacturing an electronic device according to the first embodiment of the invention.
Figure 7B:
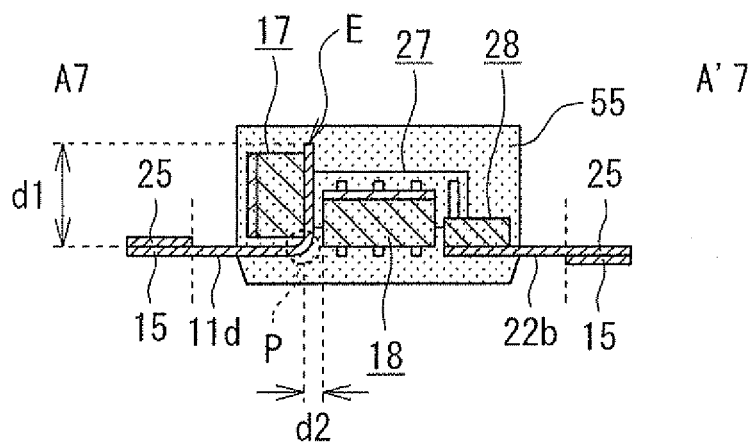

Thus, as shown in FIGS. 7A and 7B, a resin package 55 is formed, and the electronic parts 17, 18, 27, and 28 are sealed in the resin package 55. That is, the electronic parts 17, 18, 27, and 28 are sealed with resin. Thereafter, the cavity is opened to extract the resin package 55, the dam bars 13, 14, 23, and 24 outside the resin package 55 are cut to respectively separate the leads 11a to 11e, 12a to 12d, 21a to 21e, and 22a to 22e. The leads 11a to 11e, 12a to 12d, 21a to 21e, and 22a to 22e are cut from the support frames 15 and 25, so that the resin package 55 is separated from the support frames 15 and 25. Therefore, the leads 11a to 11e, 12a to 12d, 21a to 21e, and 22a to 22e become separate external connection terminals. In such a manner, an electronic device is completed.

In this electronic device, the leads 11a to 11e are bent at the point P, and the attached portions of the leads 11a to 11d are arranged outside the first region. For this reason, as shown in FIG. 7B, for example, focusing on the positional relationship between the lead 11d and the electronic part 18, the distance d2 from the point P of the lead 11d to the electronic part 18 is shorter than the distance d1 from the point P of the lead 11d to the front end E of the lead 11d.

Figure 8:
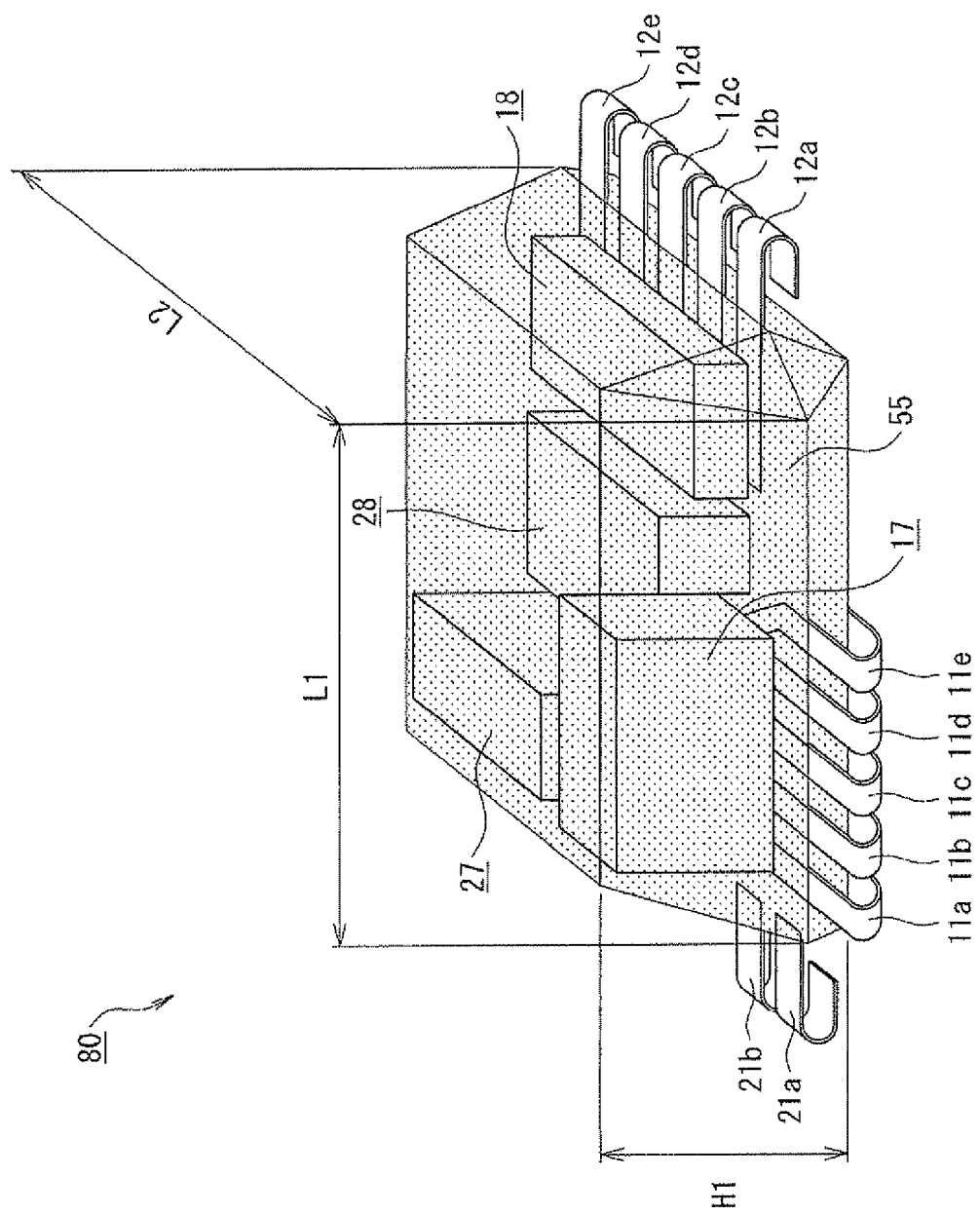
FIG. 8 is a diagram showing a configuration example of an electronic device according to the first embodiment of the invention.

FIG. 8 is a diagram showing a configuration example of an electronic device according to the first embodiment of the invention. An electronic device 80 shown in FIG. 8 is manufactured by, for example, the manufacturing method described with reference to FIGS. 1A to 7B.

In the electronic device 80, with regard to the dimension of the resin package 55, for example, when the length in the transverse direction is L1, the length of the longitudinal direction is L2, and the height is H1, L1=10.0 mm, L2=10.0 mm, and H1=4.3 mm (these values are just an example). In the electronic device 80, for example, the leads (that is, external connection terminals) 11a to 11e, 12a to 12e, 21a, 21b, . . . exposed from the resin package 55 may be bent to form a QFJ (Quad Flat J-lead Package) type package. In this case, the occupying area of the entire resin package including the leads on the mounting substrate can be reduced.

Figure 9A:
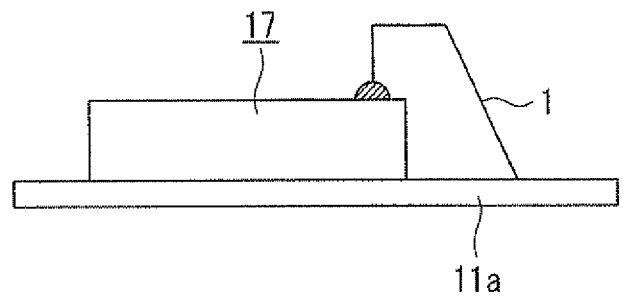
FIGS. 9A to 9C are diagrams showing an example of electrical connection of an electronic part and a lead.
Figure 9B:
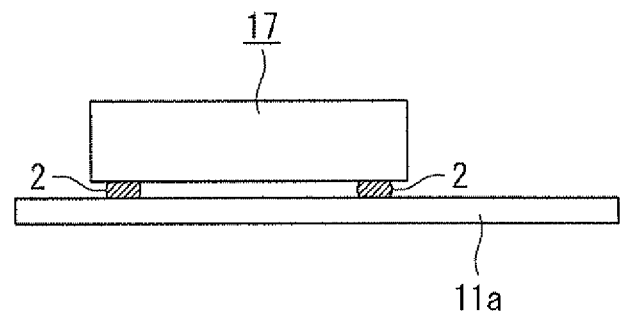
Figure 9C:
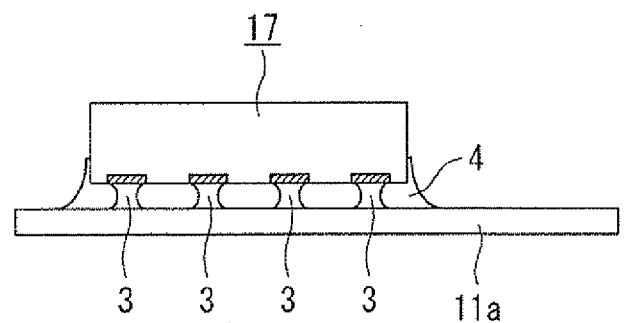

FIGS. 9A to 9C are sectional views showing an example of electrical connection of an electronic part and a lead. As shown in FIG. 9A, for example, electrical connection of the terminal of the electronic part 17 and the lead 11a may be carried out by wire-bonding using a gold wire 1. Alternatively, as shown in FIG. 9B or 9C, the electronic part 17 may be mounted on the lead 11a in a face-down manner. In the case of face-down, as shown in FIG. 9B, connection of the terminal of the electronic part 17 and the lead 11a may be carried out by using, for example, ball-like bumps 2. As shown in FIG. 9C, for example, solders 3 may be used. Bonding of the electronic part 17 and the lead 11a may be carried out by, for example, an adhesive 4. With regard to electrical connection or bonding of the electronic part 17 and other leads 11b to 11e or other electronic parts and other leads, the examples shown in FIGS. 9A to 9C may be applied.

As described above, according to the first embodiment of the invention, the divided lead frames 10 and 20 are arranged to overlap each other, so that the single lead frame 50 can be formed. Thus, the electronic parts 17, 18, 27, and 28 can be arranged three-dimensionally by using the single lead frame 50. That is, a plurality of electronic parts can be arranged densely in the single lead frame 50 by changing the height or angle of the mounting surfaces of the electronic parts. For this reason, an increase in the size of the resin package 55 can be suppressed.

In the first embodiment, a case has been described in which, after the leads 11a to 11e and 21a to 21e of the divided lead frames 10 and 20 are all bent, the divided lead frames 10 and 20 are arranged to overlap each other so as to form the single lead frame. However, the invention is not limited thereto. For example, the electronic part 18 may be electrically connected to the lead 11a while the lead 11a of the leads 11a to 11e of the divided lead frame 10 is not bent.

Figure 10A:
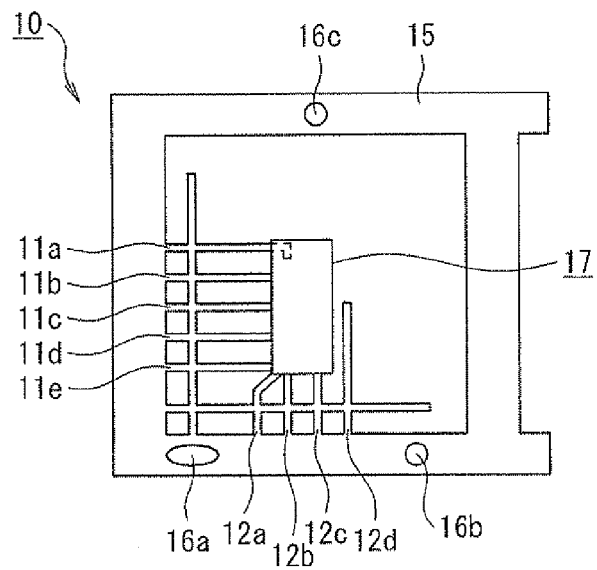
FIGS. 10A to 10C are diagrams showing another method of manufacturing an electronic device according to the first embodiment of the invention.
Figure 10B:
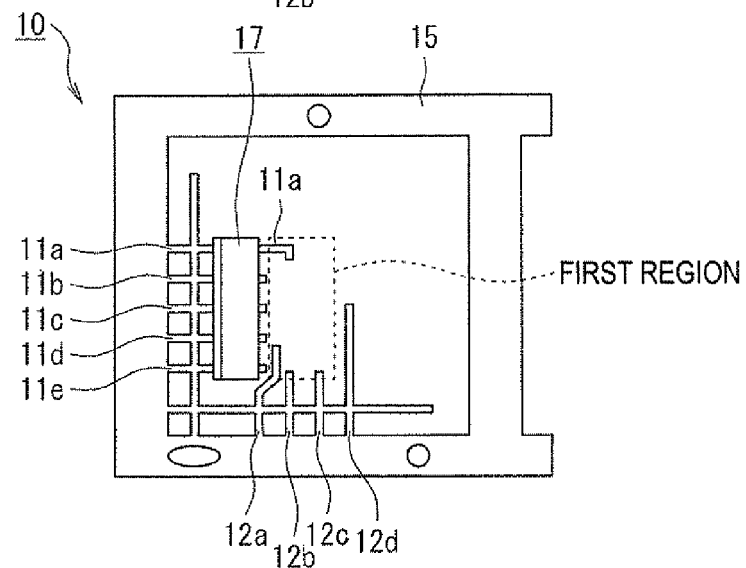
Figure 10C:
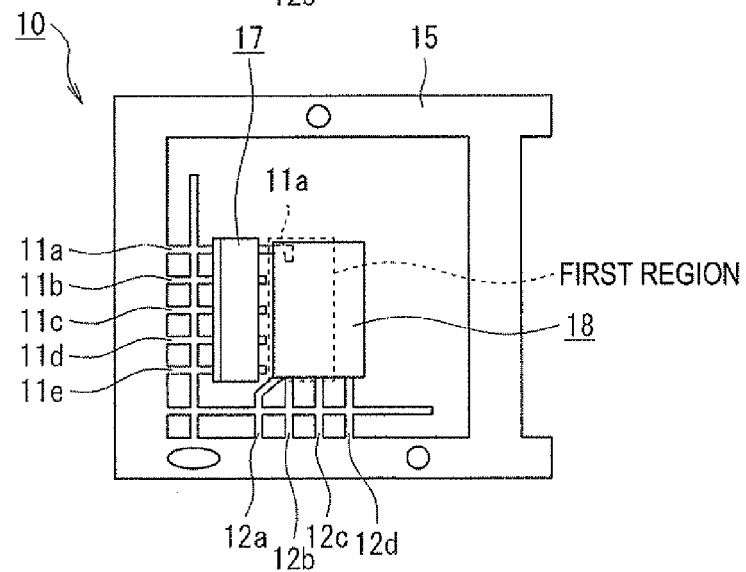

FIGS. 10A to 10C are diagrams showing another method of manufacturing an electronic device according to the first embodiment of the invention. As shown in FIG. 10A, the electronic part 17 is attached onto the leads 11b to 11e of the divided lead frame 10, but the electronic part 17 is not attached to the leads 11a. That is, while the leads 11b to 11e and the electronic part 17 are electrically connected to each other, the leads 11a and the electronic part 17 are not electrically connected to each other.

Next, as shown in FIG. 10B, in the divided lead frame 10, the leads 11b to 11e are bent such that the electronic part 17 and the attached portions of the leads 11b to 11e are located outside the first region. At this time, the lead 11a is not bent and the front end of the lead 11a remains in the first region. Then, as shown in FIG. 10C, the electronic part 18 is attached onto the leads 11a and 12a to 12d of the divided lead frame 10. In such a method, the leads 11b to 11e which are electrically connected to the electronic part 17 are already bent, and the electronic part 17 and the attached portions of the leads 11b to 11e are located outside the first region, so that the electronic parts 17 and 18 can be prevented from coming into contact with each other.

(2) Second Embodiment

In the first embodiment, a case has been described in which, after the leads 11a to 11e of the divided lead frame 10 and the leads 21a to 21d of the divided lead frame 20 are respectively bent, the divided lead frames 10 and 20 are arranged to overlap each other so as to form the single lead frame 50. That is, a case where the leads of the divided lead frames 10 and 20 are bent has been described. However, the invention is not limited thereto. For example, the leads of one of the two divided lead frames 10 and 20 may not be bent.

Figure 11A:
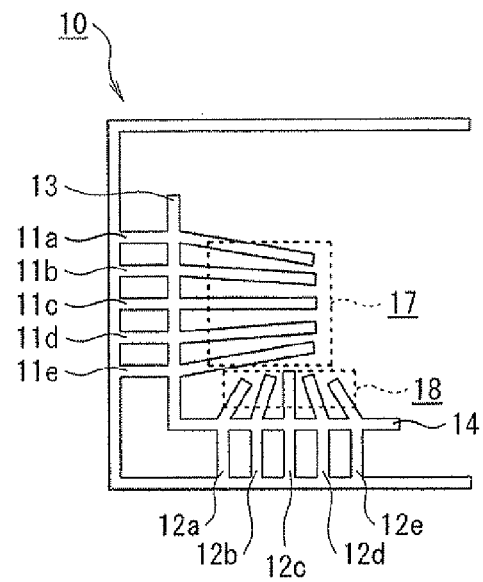
FIGS. 11A to 11C are diagrams showing a method of manufacturing an electronic device according to a second embodiment of the invention.
Figure 11B:
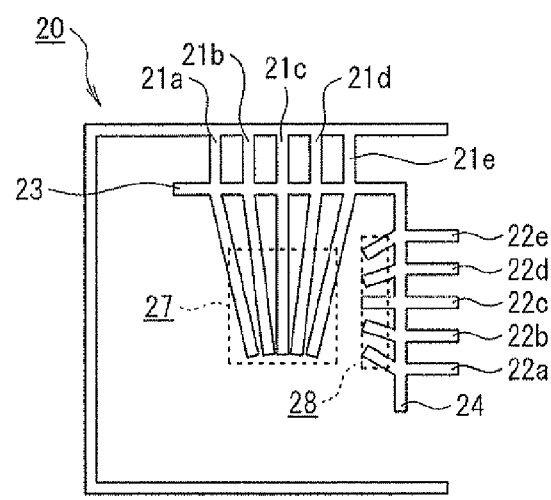
Figure 11C:
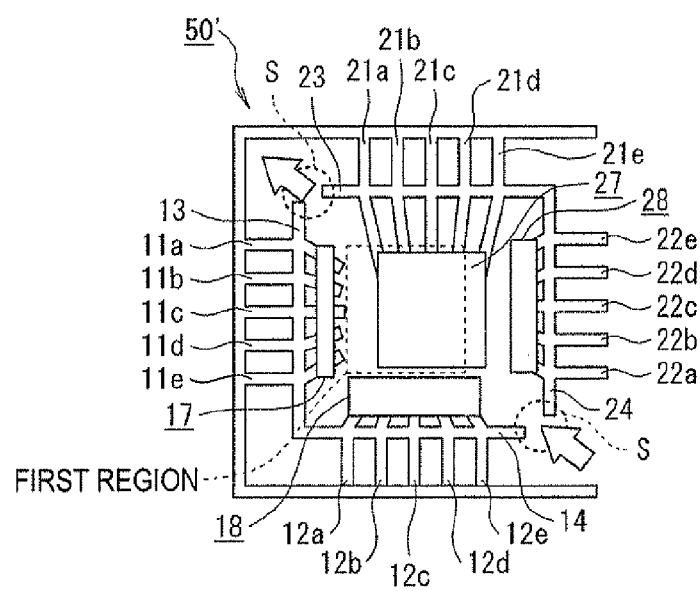

FIGS. 11A to 11C are diagrams showing a method of manufacturing an electronic device according to a second embodiment of the invention.

As shown in FIG. 11A, first, the electronic part 17 is attached onto the leads 11a to 11e of the divided lead frame 10, and the electronic part 18 is attached onto the leads 12a to 12e. Similarly, as shown in FIG. 11H, the electronic part 27 is attached onto the leads 21a to 21e of the divided lead frame 20, and the electronic part 28 is attached onto the leads 22a to 22e. Next, in the divided lead frame 10 shown in FIG. 11A, the leads 11a to 11e are bent such that the electronic part 17 and the attached portions of the leads 11a to 11e to which the electronic part 17 is attached are located outside the first region. At this time, for example, a force may be applied to the attached portions of the leads 11a to 11e upward from below by using a mold or the like so as to bend the leads 11a to 11e. The leads 21a to 21e may be bent in the same manner as the leads 11a to 11e. Thereafter, as shown in FIG. 11C, the divided lead frames 10 and 20 are arranged to overlap each other so as to form a single lead frame 50'.

At this time, the electronic part 17 and the attached portions of the leads 11a to 11e are located outside the first region. For this reason, even when at least a portion of the electronic part 27 or at least portions of the attached portions of the leads 21a to 21c to which the electronic part 27 is attached are located in the first region, the electronic parts 17 and 18 or the leads 11a to 11e and 21a to 21e can be prevented from coming into contact with each other.

Therefore, like the first embodiment, a plurality of electronic parts can be arranged densely in the single lead frame 50' by changing the height or angle of the mounting surfaces of the electronic parts, so that an increase in the size of the resin package can be suppressed.

In the first or second embodiment, when the divided lead frames 10 and 20 are arranged to overlap each other so as to form the single lead frame 50 or 50', it is preferable to design the shapes of the divided lead frames such that a clearance is formed between adjacent dam bars. A plurality of clearances may be provided in the single lead frame 50 or 50'. For example, as shown in FIG. 11C, it is preferable to design the shapes of the divided lead frames 10 and 20 such that the clearances S are respectively formed between the dam bars 13 and 23 and between the dam bars 14 and 24. For example, it is preferable to design the shapes of the divided lead frames 10 and 20 such that the clearance S is formed from the inside of a region surrounded by the dam bars 13, 14, 23, and 24 to the outside of the region.

Thus, in forming the resin package, resin sealing can be stably carried out. That is, as indicated by an arrow of FIG. 11C, mold resin can be injected into an inner region surrounded by the dam bars 13, 14, 23, and 24 or air can be discharged from the inner region to the outside by using the clearance S. Therefore, resin sealing of the electronic parts 17, 18, 27, and 28 can be stably carried out.

(3) Third Embodiment

In the first and second embodiments, a case where the two divided lead frames are arranged to overlap each other so as to form the single lead frame (that is, a two-frame structure) has been described. However, the number of divided lead frames arranged to overlap each other is not limited to two. For example, three, or four or more divided lead frames may be arranged to overlap each other so as to form a single lead frame.

FIGS. 12A to 18 are diagrams showing a method of manufacturing an electronic device according to a third embodiment of the invention.

In the third embodiment, for example, four divided lead frames are prepared and arranged to overlap each other while partially bending the leads of the divided lead frames, thereby forming a single lead frame. Thereafter, a plurality of electronic parts mounted on the leads of the lead frames are collectively sealed with resin, so that a single electronic device is completed (that is, a four-frame structure). This will be described below in detail.

Figure 12A:
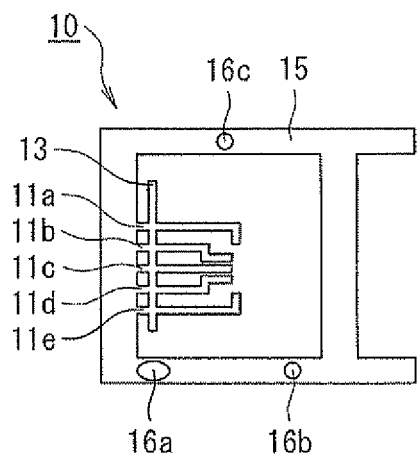
FIGS. 12A to 12D are diagrams showing a method of manufacturing an electronic device according to a third embodiment of the invention.
Figure 12B:
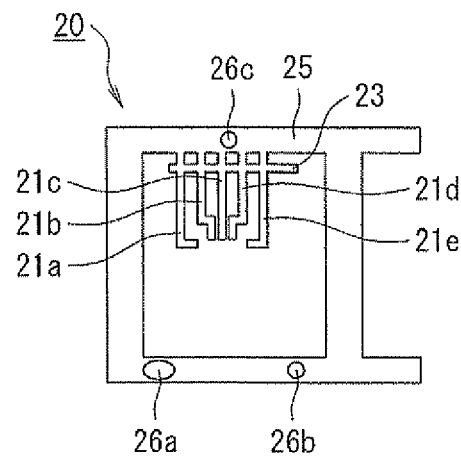
Figure 12C:
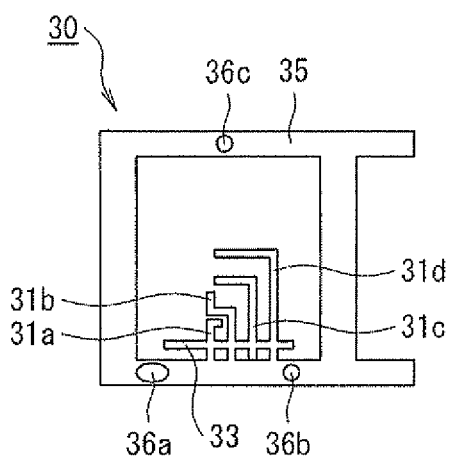
Figure 12D:
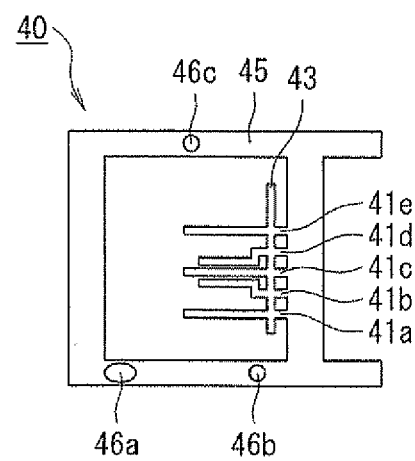

As shown in FIGS. 12A to 12D, first, four divided lead frames 10, 20, 30, and 40 are prepared. As shown in FIG. 12A, the divided lead frame 10 has, for example, a plurality of leads 11a to 11e, a dam bar 13, and a support frame 15. As shown in FIG. 12B, the divided lead frame 20 has, for example, a plurality of leads 21a to 21e, a dam bar 23, and a support frame 25. As shown in FIG. 12C, the divided lead frame 30 has, for example, a plurality of leads 31a to 31d, a dam bar 33, and a support frame 35. As shown in FIG. 12D, the divided lead frame 40 has, for example, a plurality of leads 41a to 41e, a dam bar 43, and a support frame 45. The divided lead frames 10, 20, 30, and 40 are formed separately by etching a single copperplate or punching the copper plate with a mold. As shown in FIGS. 12A to 12D, the support frames 15, 25, 35, and 45 have the same shape and size.

Figure 13A:
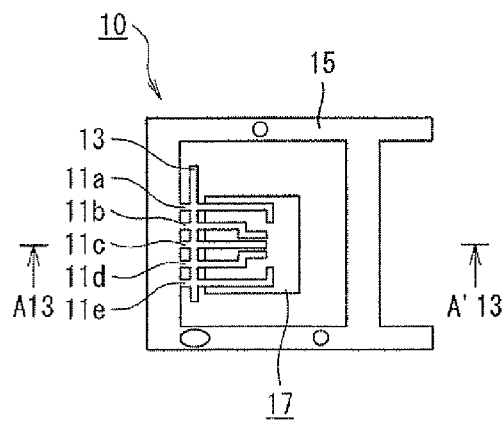
FIGS. 13A to 13H are diagrams showing the method of manufacturing an electronic device according to the third embodiment of the invention.
Figure 13B:
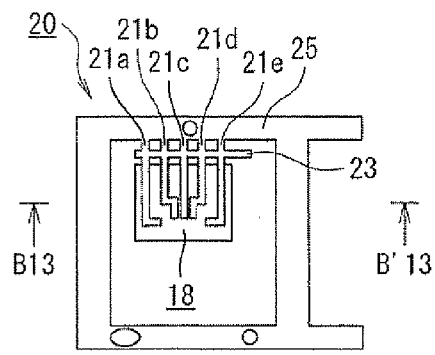
Figure 13E:
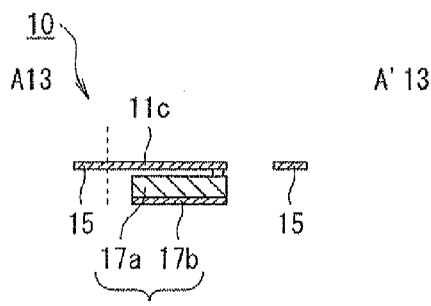
Figure 13F:
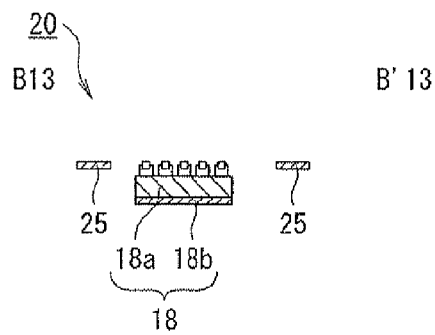
Figure 13C:
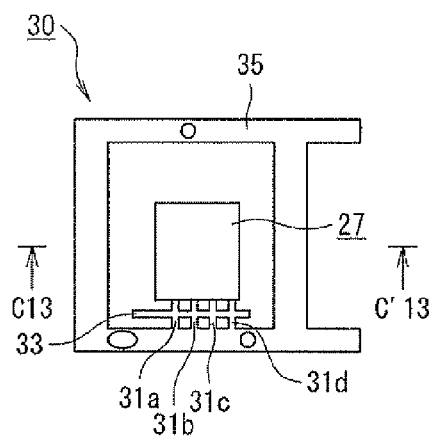
Figure 13D:
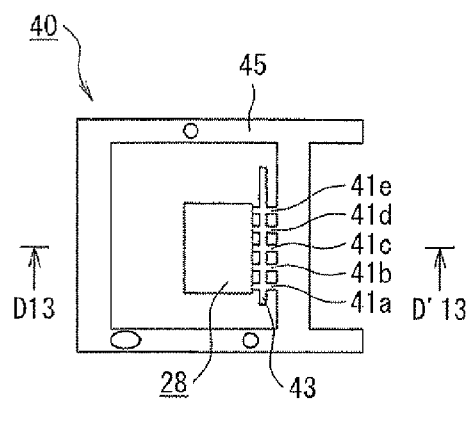
Figure 13G:
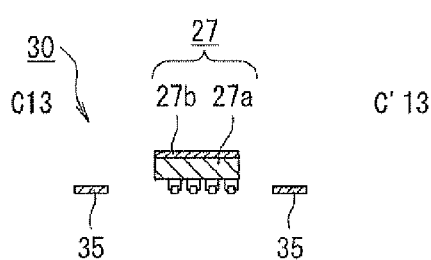
Figure 13H:
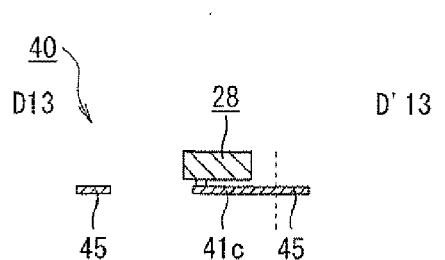

Next, as shown in FIGS. 13A and 13E, the electronic part 17 is attached onto the leads 11a to 11e of the divided lead frame 10, and the terminals of the electronic part 17 and the leads 11a to 11e are electrically connected to each other, respectively. As shown in FIGS. 13B and 13F, the electronic part 18 is attached onto the leads 21a to 21e of the divided lead frame 20, and the terminals of the electronic part 18 and the leads 21a to 21e are electrically connected to each other, respectively. As shown in FIGS. 13C and 13G, the electronic part 27 is attached onto the leads 31a to 31d of the divided lead frame 30, and the terminals of the electronic part 27 and the leads 31a to 31d are electrically connected to each other, respectively. As shown in FIGS. 13D and 13H, the electronic part 28 is attached onto the leads 41a to 41e of the divided lead frame 40, and the terminals of the electronic part 28 and the leads 41a to 41e are electrically connected to each other, respectively. The electronic parts 17, 18, and 27 are, for example, gyro sensors, and the electronic part 28 is, for example, an acceleration sensor.

Figure 14A:
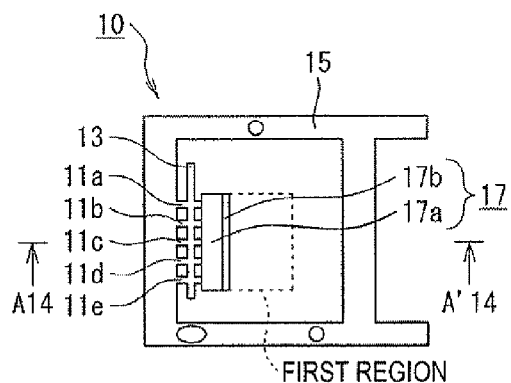
FIGS. 14A to 14H are diagrams showing the method of manufacturing an electronic device according to the third embodiment of the invention.
Figure 14B:
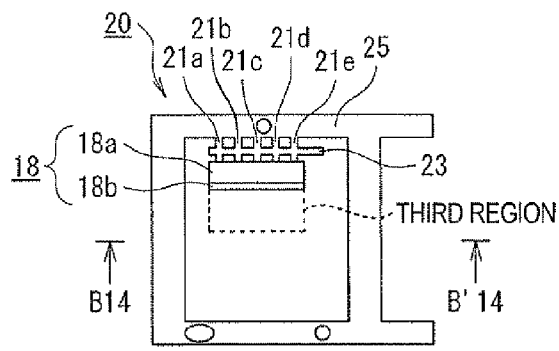
Figure 14E:
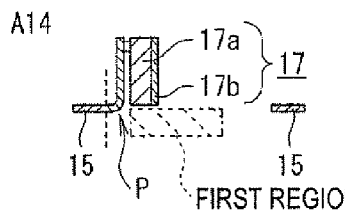
Figure 14F:
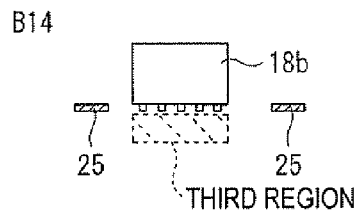

Next, as shown in FIGS. 14A and 14E, the leads 11a to 11e are bent such that the electronic part 17 and the attached portions of the leads 11a to 11e to which the electronic part 17 is attached are located outside the first region. That is, the leads 11a to 11e are bent at the point P halfway toward the front ends thereof, so that the electronic part 17 and the attached portions of the leads 11a to 11e are moved outside the first region. For example, the leads 11a to 11e are bent at the point P upward at an angle of 90° in sectional view. At this time, a force may be applied to the attached portions of the leads 11a to 11e upward from below by using a mold or the like so as to bend the leads 11a to 11e. At the time of bending, a first mold or the like may be arranged on the point P of the leads 11a to 11e, and a force may be applied to the attached portions of the leads 11a to 11e upward from below by using a second mold or the like so as to bend the leads 11a to 11e. Similarly, as shown in FIGS. 14B and 14F, the leads 21a to 21e are bent such that the electronic part 18 and the attached portions of the leads 21a to 21e to which the electronic part 18 is attached are located outside the third region. The bending angle of the leads 21a to 21e is, for example, 90° in sectional view.

Figure 14C:
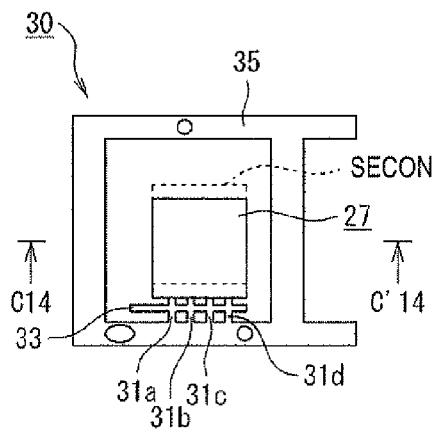
Figure 14D:
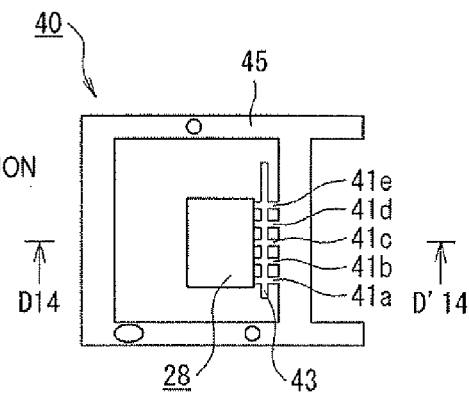
Figure 14G:
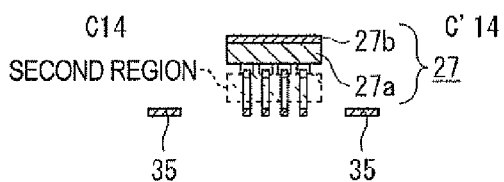
Figure 14H:
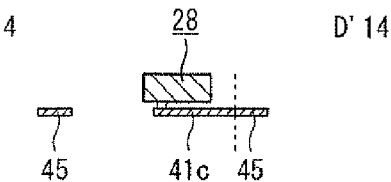
Figure 18:
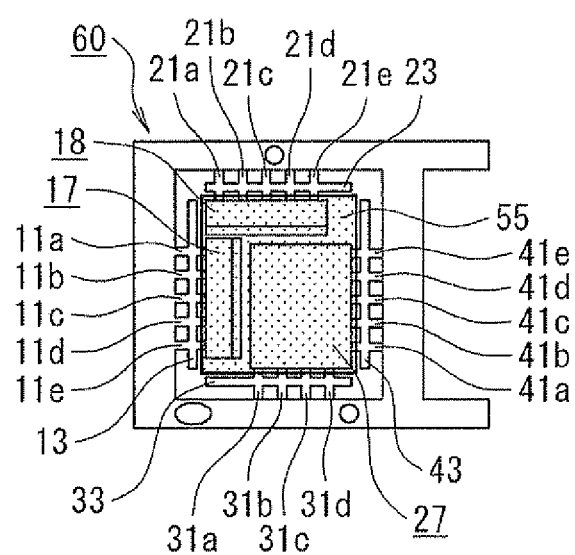
FIG. 18 is a diagram showing the method of manufacturing an electronic device according to the third embodiment of the invention.

As shown in FIGS. 14C and 14G, the leads 31a to 31d of the divided lead frame 30 are bent such that the electronic part 27 and the attached portions of the leads 31a to 31d to which the electronic part is attached are located outside the second region. For example, as shown in FIG. 15B, the leads 31a to 31d are bent at multiple places in sectional view, and the electronic part 27 is moved to the upper side of the second region. Specifically, the leads 31a to 31d are bent at a first point P1 upward (a direction in which the electronic part 27 is attached onto the leads 31a to 31d) and bent at a second point P2 in a direction opposite to P1 with respect to P2 (in other words, a direction in which P2 is present between P1 and the electronic part 27 in plan view). Thus, the attached portions of the leads 31a to 31d are moved to the upper side further than before the leads 31a to 31d are bent at the first point P1 and the second point P2 (in other words, a side on which the electronic part 27 is attached to the leads 31a to 31d). Alternatively, the leads 31a to 31d may be bent at multiple places in sectional view, so that the electronic part 27 is moved below the second region. Specifically, the leads 31a to 31d may be bent at the first point P1 downward (a direction opposite to the direction in which the electronic part 27 is attached to the leads 31a to 31d) and then bent at the second point P2 in the same direction as described above. Thus, the attached portions of the leads 31a to 31d may be moved to the lower side further than before the leads 31a to 31d are bent at the first point P1 and the second point P2 (in other words, a side opposite to the side on which the electronic part 27 is attached to the leads 31a to 31d). At this time, a force may be applied to the leads 31a to 31d by using a mold or the like so as to bend the leads 31a to 31d. The leads 31a to 31d may be bent at the first point P1 and the second point P2 in the same step. As shown in FIGS. 14D and 14H, with regard to the divided lead frame 40, the leads 41a to 41e are not bent and remain unchanged.

Next, as shown in FIGS. 15A and 15B, the divided lead frames 30 and 40 are arranged to overlap each other. Thus, at least portions of the electronic part 28 and the attached portions of the leads 41a to 41e to which the electronic part 28 is attached are located at the second region. As shown in FIG. 16, the divided lead frames 10 and 20 are arranged to overlap the divided lead frames 30 and 40 so as to form a single lead frame 60.

Thus, the electronic part 28 and the attached portions of the leads 41a to 41e are arranged, for example, at the first, second, and third regions. That is, the leads 11a to 11e, 21a to 21e, and 31a to 31d are bent, so that the electronic part 28 and the attached portions of the leads 41a to 41e are arranged in an empty space.

In this case, for example, the divided lead frames 10, 20, 30, and 40 are arranged to overlap each other in that order downward from above in sectional view so as to form the single lead frame 60. The divided lead frames 20, 10, 30, and 40 may be arranged to overlap each other in that order downward from above in sectional view to form the single load frame 60, or the divided lead frames may be arranged to overlap each other in other orders.

In the third embodiment, similarly to the first embodiment, in positioning the divided lead frames 10, 20, 30, and 40 when being arranged to overlap each other, through holes 16a to 16c, 26a to 26c, 36a to 36c, and 46a to 46c respectively formed in the divided lead frames 10, 20, 30, and 40 may be used. For example, when the divided lead frames 30 and 40 are arranged to overlap each other, the divided lead frames 30 and 40 are positioned such that the through hole 36a to 36c and the through holes 46a to 46c overlap each other in plan view (that is, match each other).

As shown in FIGS. 16A and 16B, the electronic parts 17, 18, 27, and 28 are arranged three-dimensionally in the single lead frame 60 so as to be separated from each other. Thus, the metal cap 17b of the electronic part 17 is directed in the X-axis direction, the metal cap 18b of the electronic part 18 is directed in the Y-axis direction, and the metal cap 27b of the electronic part 27 is directed in the Z-axis direction. For this reason, the electronic part 17 can be used as a gyro sensor in the X-axis direction, the electronic part 18 can be used as a gyro sensor in the Y-axis direction, and the electronic part 27 can be used as a gyro sensor in the Z-axis direction.

Next, as shown in FIGS. 17A and 17B, the lead frame 60 in which the electronic parts 17, 18, 27, and 28 are arranged three-dimensionally is arranged between the upper mold 51 and the lower mold 52, and both molds are clamped so as to sandwich the dam bars 13, 14, 23, and 24 therebetween from above and below so as to form a cavity 53. Then, mold resin is injected into the cavity 53 and hardened. Thus, as shown in FIGS. 18A and 18B, a resin package 55 is formed, and the electronic parts 17, 18, 27, and 28 are sealed in the resin package 55. Thereafter, the cavity is opened, the resin package 55 is extracted, and the dam bars 13, 23, 33, and 43 outside the resin package 55 are cut to respectively separate the leads 11a to 11e, 21a to 21e, 31a to 31d, and 41a to 41e. The leads 11a to 11e, 21a to 21e, 31a to 31d, and 41a to 41e are cut from the support frames 15, 25, 35, and 45, so that the resin package 55 is separated from the support frames 15, 25, 35, and 45. Therefore, the leads 11a to 11e, 21a to 21e, 31a to 31d, and 41a to 41e become separate external connection terminals. In such a manner, an electronic device is completed.

Figure 19A:
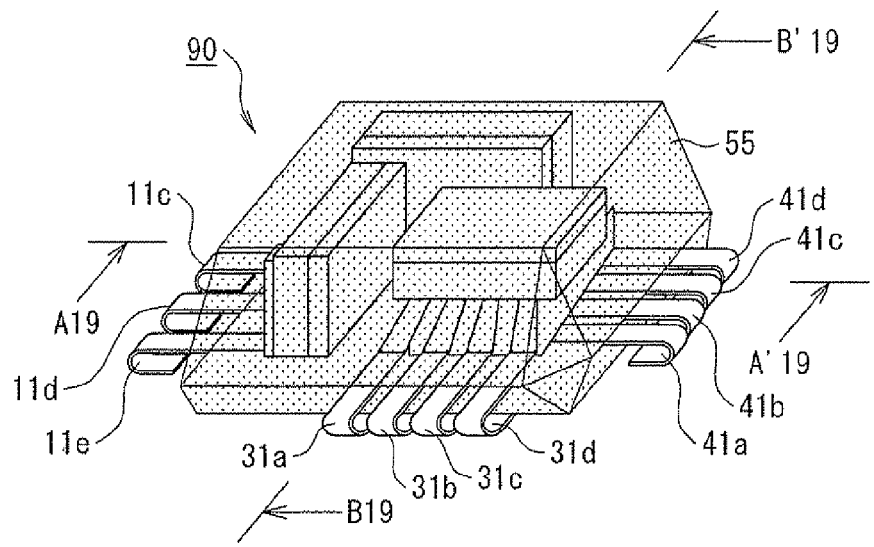
FIGS. 19A to 19C are diagrams showing a configuration example of an electronic device according to the third embodiment of the invention.
Figure 19B:
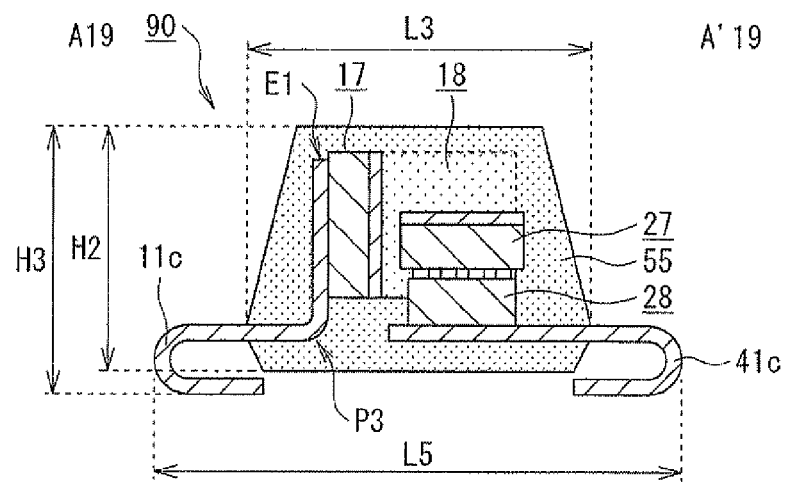
Figure 19C:
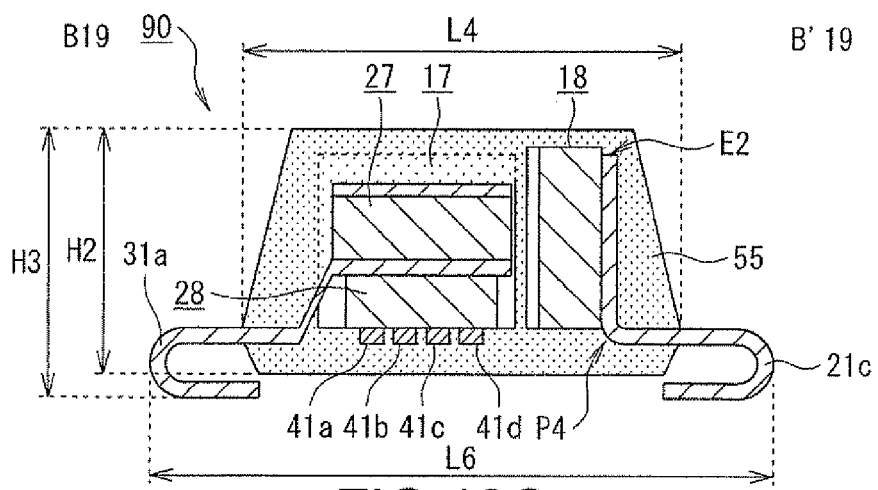

FIGS. 19A to 19C are diagrams showing a configuration example of an electronic device according to the third embodiment of the invention. An electronic device 90 shown in FIGS. 19A to 19C is manufactured by, for example, the manufacturing method described with reference to FIGS. 12A to 18.

In the electronic device 90, with regard to the dimension of the resin package 55, for example, when the length in the transverse direction is L3, the length in the longitudinal direction is L4, and the height is H2, L3=80 mm, L4=9.0 mm, and H2=3.9 mm (these values are just an example).

With regard to the dimension of the entire electronic device 90 including the leads, for example, when the length of the transverse direction is L5, the length of the longitudinal direction is L6, and the height is H3, L5=90 mm, L6=10.0 mm, and H3=4.0 mm (these values are just an example).

As shown in FIG. 19B, in the electronic device 90, the lead 11c of the divided lead frame 10 is bent at a point P3, and the attached portion of the lead 11c is arranged outside the first region. For this reason, the distance from the point P3 of the lead 11c to the electronic part 28 is shorter than the distance from the point P3 of the lead 11c to the front end E1 of the lead 11c. The distance from the point P3 of the lead 11c to the attached portion of the lead 41c is shorter than the distance from the point P3 of the leads 11c to the front end E1 of the lead 11c.

Similarly, as shown in FIG. 19C, in the electronic device 90, the lead 21c of the divided lead frame 20 is bent at a point P4, and the attached portion of the lead 21c is arranged outside the third region. For this reason, the distance from the point P4 of the lead 21c to the electronic part 28 is shorter than the distance from the point P4 of the lead 21c to the front end E2 of the lead 21c. The distance from the point P4 of the lead 21c to the attached portion of the lead 41d is shorter than the distance from the point P4 of the lead 21c to the front end E2 of the lead 21c.

As shown in FIGS. 19A to 19C, in the electronic device 90, the leads (that is, external connection terminals) 11a to 11e, 21a to 21e, 31a to 31d, and 41a to 41e exposed from the resin package 55 may be bent to form a QFJ type package. In this case, the occupying area of the entire resin package including the leads on the mounting substrate can be reduced.

In the third embodiment, similarly to the first embodiment, electrical connection of the electronic parts and the leads may be carried out by wire-bonding or in a face-down manner. In the case of face-down, connection of the terminals of the electronic parts and the leads may be carried out by ball-like bumps or solders. Bonding of the electronic parts and the leads may be carried out by using an adhesive (see FIGS. 9A to 9C).

As described above, according to the third embodiment of the invention, the divided lead frames 10, 20, 30, and 40 are arranged to overlap each other, so that the single lead frame 60 can be formed. Thus, the electronic parts 17, 18, 27, and 28 can be arranged three-dimensionally by using the single lead frame 60. That is, a plurality of electronic parts can be arranged densely in the single lead frame 60 by changing the height or angle of the mounting surfaces of the electronic parts. For this reason, an increase in the size of the resin package 55 can be suppressed.

Figure 20A:
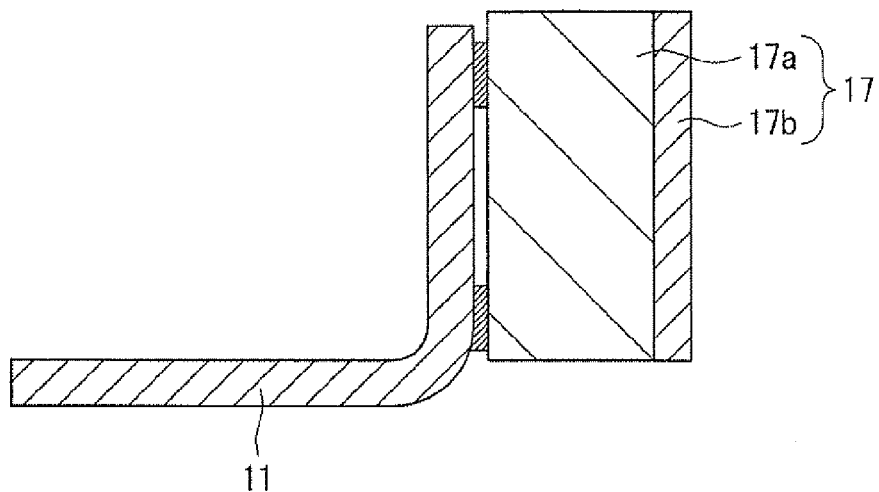
FIGS. 20A and 20B are diagrams showing an example of internal bending and external bending.
Figure 20B:
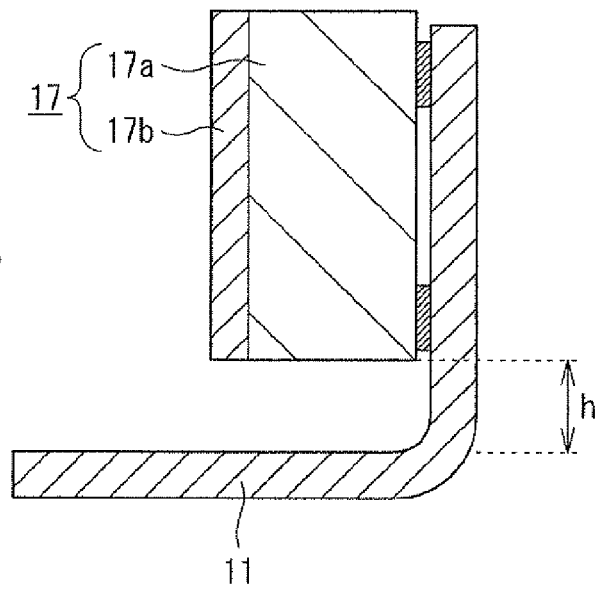

In the third embodiment, as shown in FIG. 20A, a case where the electronic part 17 is attached onto the external side surface of the bent lead 11 (that is, external bending) has been described. However, the invention is not limited thereto. For example, as shown in FIG. 20B, the electronic part 17 may be attached onto the internal side surface of the bent lead 11 (internal bending). With this configuration, the electronic part 17 and the attached portion of the lead 11 can be moved outside the first region, contributing to suppression of an increase in the size of the resin package.

Meanwhile, to reduce the height of the resin package, external bending rather than internal bending is preferably used. That is, external bending rather than internal bending allows reduction in thickness of the resin package. The reason is that, when internal bending is used, it is necessary to ensure a space between the electronic part 17 and a different portion of the lead 11 (other than the attached portion), and the mounting height of the electronic part 17 increases by a height h corresponding to the space.

In the third embodiment, when the divided lead frames 10, 20, 30, and 40 are arranged to overlap each other so as to form the single lead frame 60, it is preferable to design the shapes of the divided lead frames 10, 20, 30, and 40 such that a clearance is formed between adjacent dam bars. A plurality of clearances may be provided in the single lead frame 60. Thus, in forming the resin package, mold resin can be injected into the inner region surrounded by the dam bars 13, 14, 23, and 24 or air can be discharged from the inner region to the outside by using the clearance. Therefore, resin sealing of the electronic parts 17, 18, 27, and 28 can be stably carried out.

In the third embodiment, a case where the leads 31a to 31d are bent such that the electronic part 27 is located above the upper side of the electronic part 28 has been described. However, the invention is not limited thereto. For example, the leads 31a to 31d may be bent such that the electronic part 27 is located below the electronic part 28. With this method, the electronic parts 27 and 28 can be arranged three-dimensionally by changing the height of the mounting surfaces of the electronic parts 27 and 28, contributing to suppression of an increase in the size of the resin package 55.

(4) Fourth Embodiment

In the first and second embodiments, the two-frame structure has been described, and in the third embodiment, the four-frame structure has been described. However, the invention is not limited to the structure (that is, a multi-frame structure) in which a plurality of divided lead frames are arranged to overlap each other so as to form a single lead frame. For example, a one-frame structure in which a plurality of electronic parts are mounted by using a single lead frame may be used. Hereinafter, this will be described below in connection with an example.

Figure 21A:
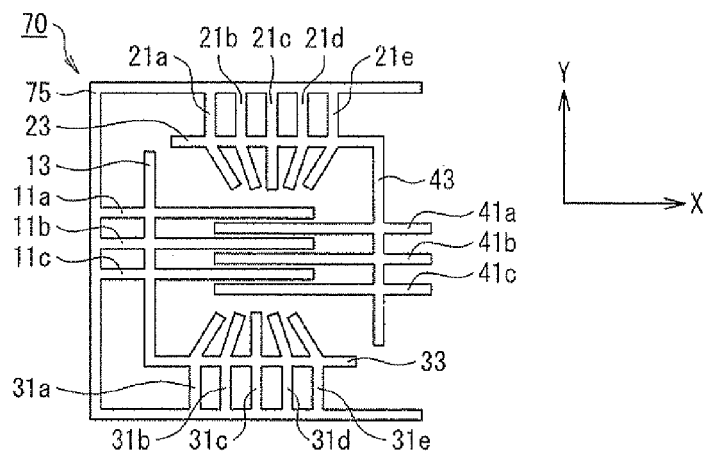
FIGS. 21A to 21D are diagrams showing a method of manufacturing an electronic device according to a fourth embodiment of the invention.

FIGS. 21A to 21D are diagrams showing a method of manufacturing an electronic device according to a fourth embodiment of the invention. As shown in FIG. 21A, first, a lead frame 70 is prepared which has leads 11a to 11c, 21a to 21e, 31a to 31e, and 41a to 41c.

As shown in FIG. 21A, the leads 11a to 11c and the leads 41a to 41c are respectively supported by the dam bars 13 and 43 arranged to be opposite each other. The leads 11a to 11c and the leads 41a to 41c extend in the X-axis direction. The leads 11a to 11c and the leads 41a to 41c are arranged alternately (that is, a comb-teeth shape) in plan view.

The lead frame 70 is formed by etching a single copper plate or punching the copper plate with a mold. Thus, the leads 11a to 11c, 21a to 21e, 31a to 31e, and 41a to 41c, the dam bars 13, 23, 33, and 43, and a support frame 75 are formed as a single body from the single copper plate.

Figure 21B:
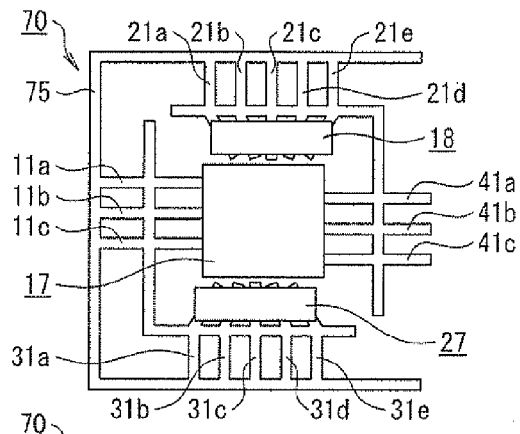
Figure 21C:
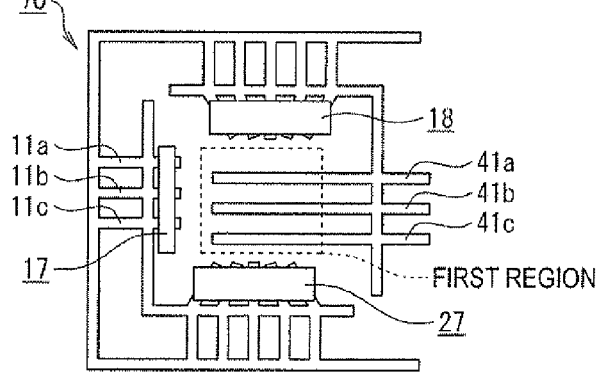

Next, as shown in FIG. 21B, the electronic parts 17, 18, and 27 are respectively attached to the leads 11a to 11c, 21a to 21e, and 31a to 31e. Then, as shown in FIG. 21C, the leads 11a to 11c are bent such that the electronic part 17 and the attached portions of the leads 11a to 11c to which the electronic part 17 is attached are located outside the first region. The bending angle of the leads 11a to 11c is, for example, 90° in sectional view.

Figure 21D:
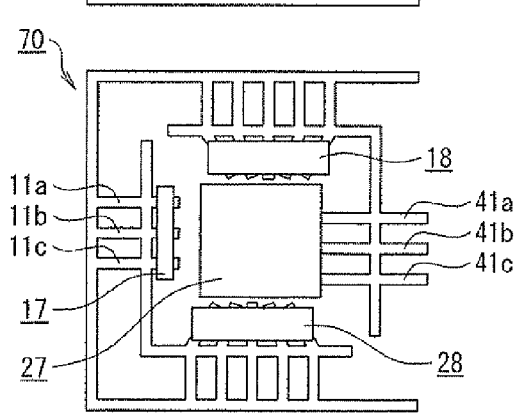

The leads 21a to 21e, 31a to 31e, and 41a to 41c are not bent and maintained to extend in the horizontal direction. In particular, after the leads 11a to 11c are bent and, as described below, before the electronic part 28 is attached, at least portions of the leads 41a to 41c are located in the first region. Next, as shown in FIG. 21D, the electronic part 28 is attached to at least portions of the portions of the leads 41a to 41c which are located in the first region. At this time, the electronic part 17 and the attached portions of the leads 11a to 11c are already moved outside the first region, so that the electronic part 28 can be attached onto the portions of the leads 41a to 41c, which are located in the first region, without coming into contact with the electronic part 17 and the leads 11a to 11c.

Subsequent steps are the same as those in the first to third embodiments. That is, the lead frame 70 in which the electronic parts 17, 18, 27, and 28 are arranged three-dimensionally is arranged between the upper mold and the lower mold, and both molds are clamped so as to sandwich the dam bars 13, 23, 33, and 43 therebetween from above and below to form the cavity. Then, mold resin is injected into the cavity and hardened. Thus, the electronic parts are sealed with resin. Thereafter, the dam bars 13, 23, 33, and 43 outside the resin package are cut to respectively separate the leads 11a to 11c, 21a to 21e, 31a to 31e, and 41a to 41c. The leads 11a to 11c, 21a to 21e, 31a to 31e, and 41a to 41c are cut from the support frame 75 to separate the resin package from the support frame 75. In such a manner, an electronic device having the electronic parts 17, 18, 27, and 28 is completed.

As described above, according to the fourth embodiment of the invention, the electronic parts 17, 18, 27, and 28 can be arranged three-dimensionally by using the single lead frame 70. That is, a plurality of electronic parts can be arranged densely in the single lead frame 70 by changing the height or angle of the mounting surfaces of the electronic parts. For this reason, even when a plurality of electronic parts are arranged in a single resin package, an increase in the size of the resin package can be suppressed.

In the fourth embodiment, in the lead frame 70, it is preferable to provide a clearance between adjacent dam bars. A plurality of clearances may be provided in the single lead frame 70. Therefore, similarly to the first to third embodiments, resin sealing can be stably carried out.

(5) Fifth Embodiment

Although in the first to fourth embodiments, a case where, with regard to the lead frames 50, 50', 60, and 70, a clearance is provided between adjacent dam bars has been described, a dummy cavity which is continuous to the clearance may be provided in the lead frame 50, 50', 60, or 70. Therefore, the resin sealing step can be more stably carried out.

Figure 22A:
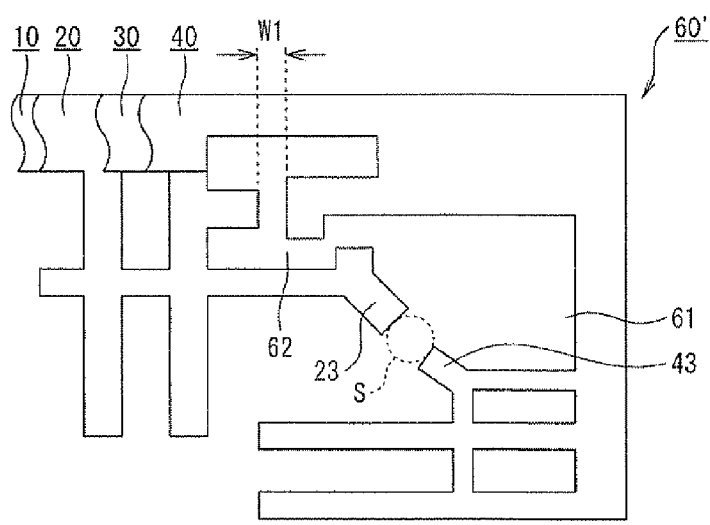
FIGS. 22A to 22C are diagrams showing a configuration example of a lead frame according to a fifth embodiment of the invention.
Figure 22B:
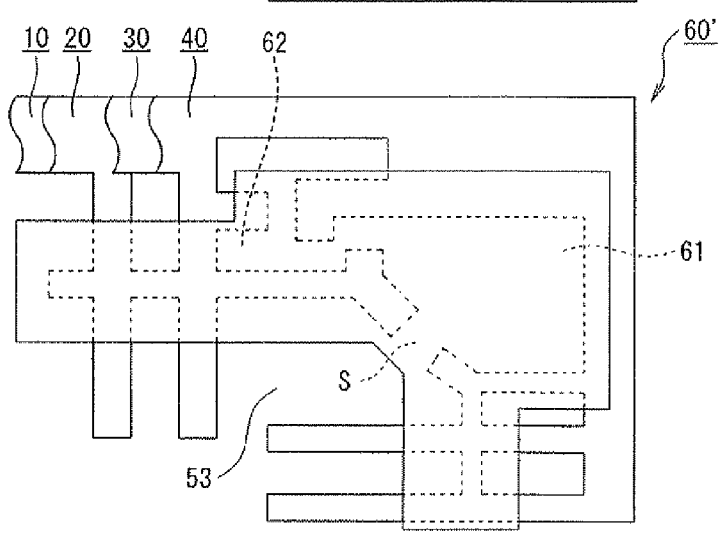
Figure 22C:
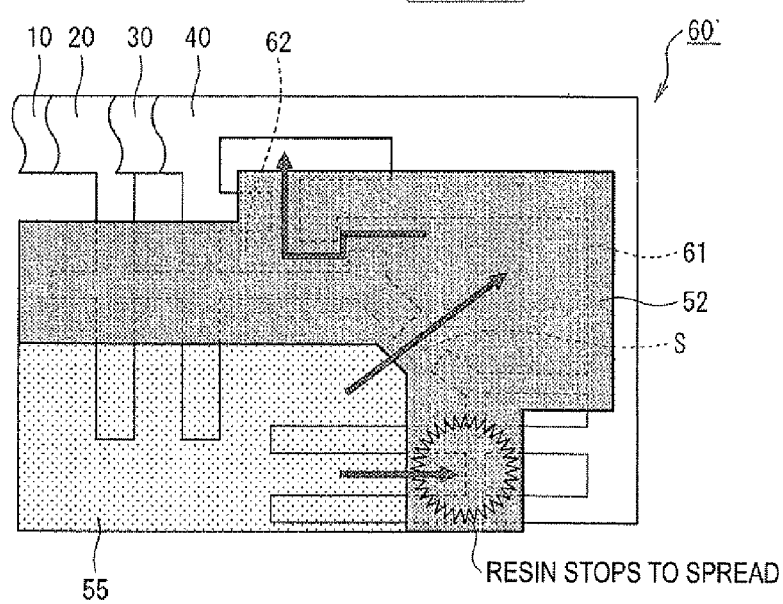
Figure 24A:
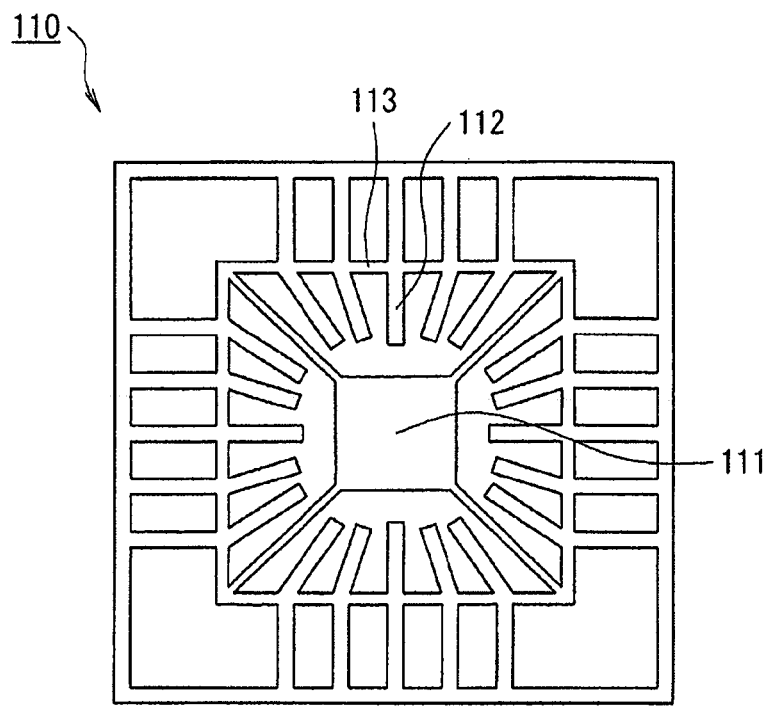
FIGS. 24A and 24B are diagrams showing the related art.
Figure 24B:
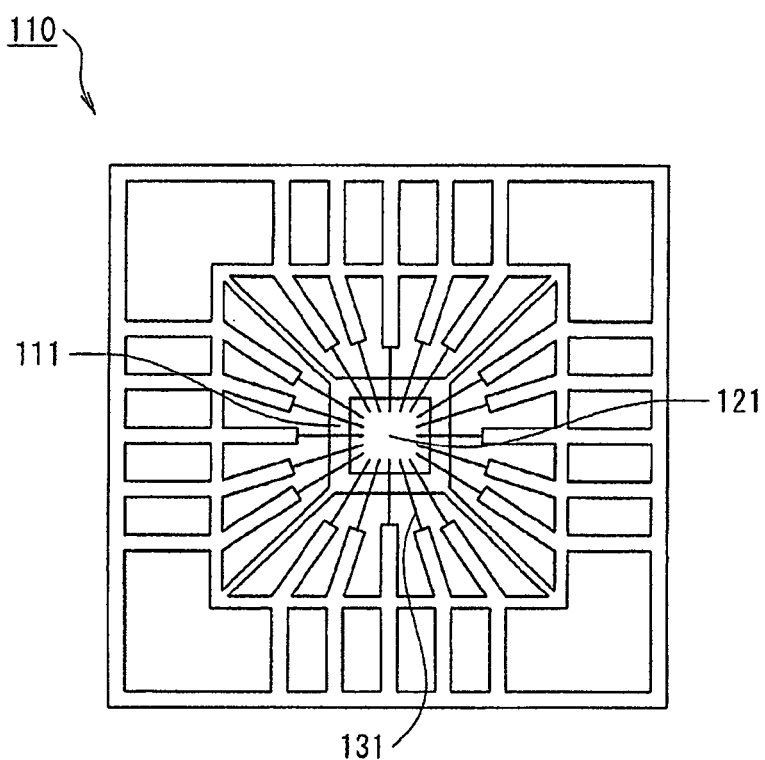
Figure 25A:
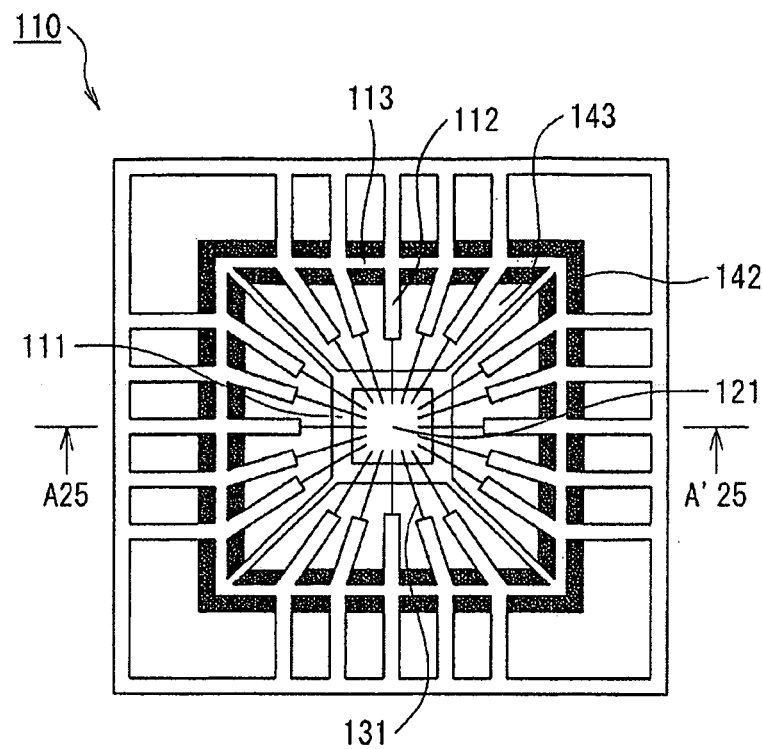
FIGS. 25A and 25B are diagrams showing the related art.
Figure 25B:
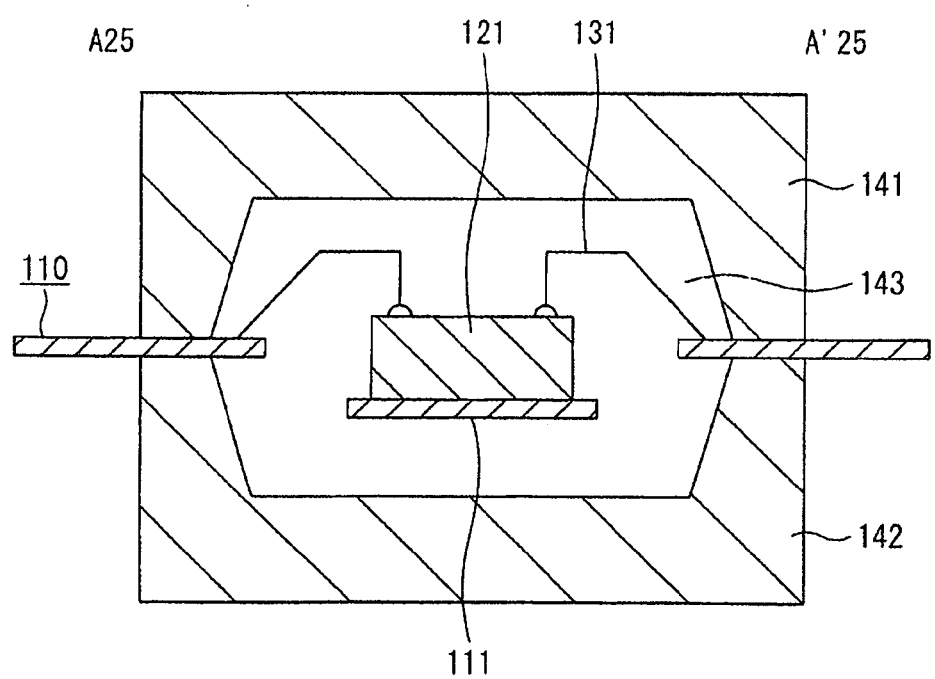
Figure 26A:
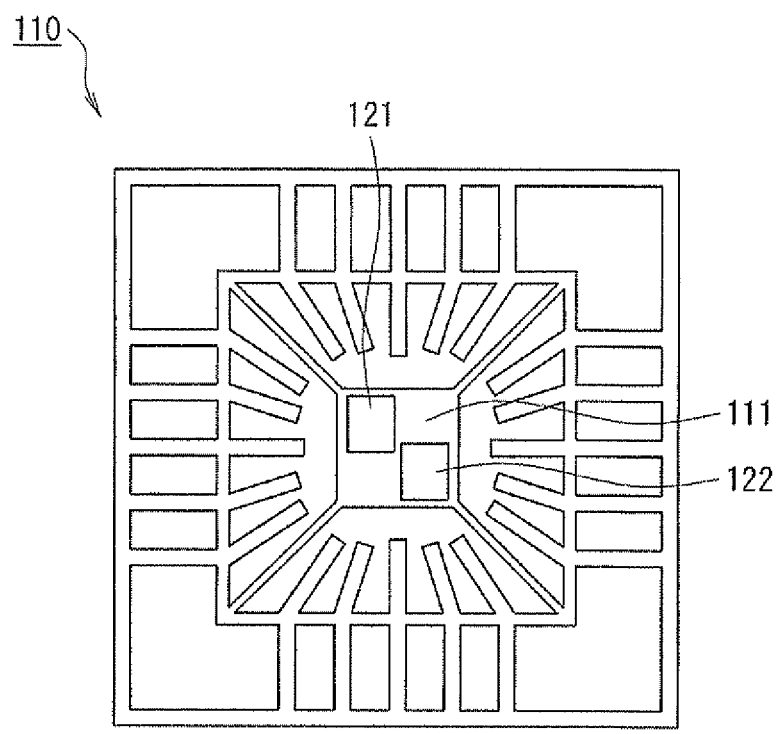
FIGS. 26A and 26B are diagrams showing the problem.
Figure 26B:
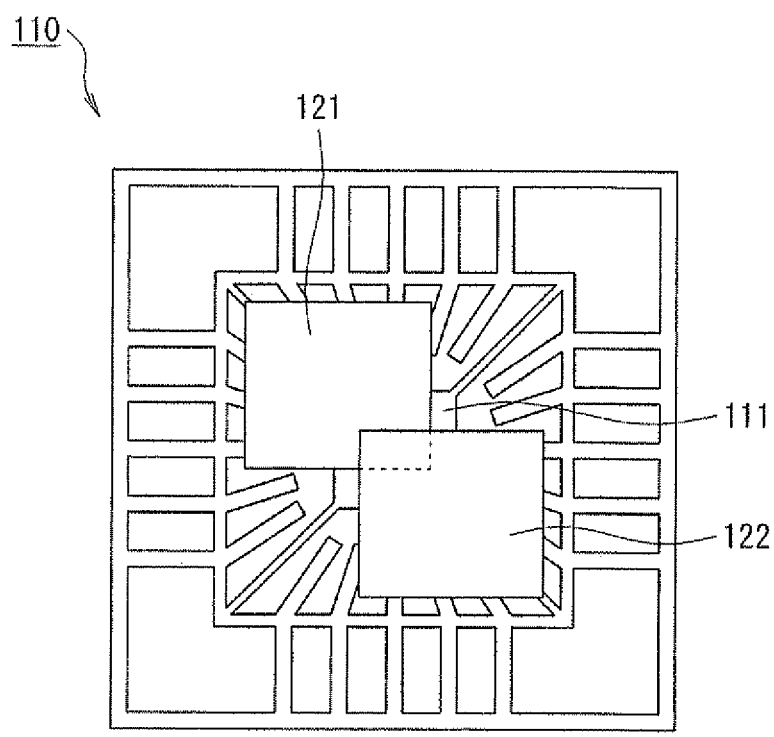

FIGS. 22A to 22C are diagrams showing a configuration example of a lead frame and a resin sealing step according to the fifth embodiment of the invention.

A lead frame 60' shown in FIG. 22A is formed by arranging the divided lead frames 10, 20, 30, and 40 to overlap each other. In the lead frame 60', a clearance S is provided between the dam bar 23 of the divided lead frame 20 and the dam bar 43 of the divided lead frame 40. Though not shown in FIG. 22A, a clearance S is also provided between the dam bar 13 of the divided lead frame 10 and the dam bar 33 of the divided lead frame 30 (for example, see FIG. 16).

As shown in FIG. 22A, in the lead frame 60', a dummy cavity 61 and a flow channel 62 which are continuous to the clearance S are provided. The dummy cavity 61 is provided to prevent mold resin flowing out of the cavity 53 (for example, see FIG. 17) from flowing outside the mold. The flow channel 62 is provided to allow part of mold resin to flow further from the dummy cavity 61 when mold resin cannot be received by the dummy cavity 61. As shown in FIG. 22A, the dummy cavity 61 and the flow channel 62 are provided outside the region surrounded by the dam bars 13, 23, 33, and 43. For example, the outlines of the dummy cavity 61 and the flow channel 62 are formed by the dam bars 23 and 43 and the respective support frames of the divided lead frames 10, 20, 30, and 40.

As shown in FIG. 22B, in the resin sealing step, the upper mold 51 and the lower mold 52 (for example, see FIG. 17) are clamped such that the dam bars 23 and 43, the clearance S, the dummy cavity 61, and part of the flow channel 62 are sandwiched therebetween from above and below, thereby forming the cavity 53. Then, as shown in FIG. 22C, mold resin 55 is injected into the cavity 53. When this happens, the mold resin 55 in the cavity 53 spreads around the cavity 53 due to injection pressure of the mold resin 53, but the spread is suppressed by the respective dam bars of the divided lead frames 10, 20, 30, and 40. Meanwhile, no dam bar is provided at the clearance S, so that part of the mold resin 55 flows from the cavity 53 to the dummy cavity 61 through the clearance S.

When the mold resin 55 cannot be received by the dummy cavity 61, part of the mold resin 55 flows from the dummy cavity 61 to the flow channel 62. However, the flow channel 62 is provided to detour outward of the support frame, and part of the flow channel 62 has a meandering shape in plan view. For this reason, as indicated by an arrow of FIG. 22C, the mold resin 55 detours while meandering, so that the mold resin 55 can be prevented from flowing outside the mold.

In FIG. 22A, the width W around the outlet port of the flow channel 62 is preferably, for example, equal to or smaller than the diameter of a filler (particle) included in the mold resin 55. If the diameter of the filler is, for example, 50 μm, the width W of the flow channel 62 is preferably equal to or smaller than 50 μm. The reason is that, if the width W is greater than the diameter of the filler, the mold resin 55 is smoothly discharged. As described above, if the width W is equal to or smaller than the diameter of the filler, the outflow of the mold resin 55 can be further suppressed.

FIGS. 23A to 23C are diagrams showing a configuration example of a lead frame and a resin sealing step according to the fifth embodiment.

In a lead frame 60" of FIG. 23A, a difference from the lead frame 60' of FIG. 22A is the shape around the outlet port of the flow channel 62. Specifically, as shown in FIG. 23B, the divided lead frames 30 and 40 are half-etched (or thinned by pressing using a mold) around the outlet port of the flow channel 62, and the thinned portions overlap each other to form outlet ports 62a and 62b of the flow channel 62.

With this configuration, similarly to the lead frame 60' shown in FIGS. 22A to 22C, the flow channel 62 is provided to detour outward of the support frame, and part of the flow channel 62 has a meandering shape in plan view. For this reason, as indicated by an arrow of FIG. 23C, even when the mold resin 55 cannot be received by the dummy cavity 61, the mold resin 55 can be prevented from flowing outside the mold.

In the lead frame 60", similarly to the width W shown in FIG. 22A, the widths W1 and W2 of the outlet ports 62a and 62b are preferably equal to or smaller than the diameter of the filler (particle) included in the mold resin 55. For example, when the diameter of the filler is, for example, 50 μm, the widths W1 and W2 are preferably equal to or smaller than 50 μm. Therefore, the outflow of the mold resin can be further suppressed.

The configuration of the fifth embodiment may be, not limited to the four-frame structure, applied to a two-frame structure, a multi-frame structure other than the two- or four-frame structure, or a one-frame structure. That is, the dummy cavity 61 and the flow channel 62 of the fifth embodiment may be applied to the lead frames 50, 50', and 70 of the first, second, and fourth embodiments. Therefore, in the first, second, and fourth embodiments, resin sealing of the electronic parts can be further stably carried out.

(6) Others

Although in the first to fifth embodiments, a case where a gyro sensor or an acceleration sensor is used as each of the electronic parts 17, 18, 27, and 28 has been described, the electronic parts 17, 18, 27, and 28 are not limited to a gyro sensor or an acceleration sensor, and may be other electronic parts, such as active parts or passive parts (resistors or capacitors). At this time, when a gyro sensor is used as the electronic parts 17, 18, and 27, according to the first to fifth embodiments, in particular, the electronic parts 17, 27, and 18 arranged in the single resin package can be used as a gyro sensor in the x-axis direction, a gyro sensor in the Y-axis direction, and a gyro sensor in the Z-axis direction, respectively. Particularly, the slope (that is, the orientations in the X-axis direction and the Y-axis direction) of each of the electronic parts 17 and 27 can be adjusted by bending each of the leads 11a to 11e and 21a to 21e. For this reason, the slope of each of the electronic parts 17, 18, and 27 is already set when the electronic device is completed, and it is not necessary to adjust the slope of each of the electronic parts 17, 18, and 27 in a step of attaching the electronic device to a wiring board (that is, a mounting step). In the mounting step, simply attaching one electronic device to the wiring board completes attachment of the gyro sensors in the X-axis direction, the Y-axis direction, and the Z-axis direction, and the acceleration sensor. For this reason, a workload in the mounting step can be significantly reduced, as compared with a case where the sensors are separately attached to the wiring board.

What is claimed is:

1. An electronic device, comprising:
    a first lead bent at a first point and having a first portion that is a substantially flat portion extending from the first point to a front end of the first lead;
    a second lead bent at a second point and having a second portion that is a substantially flat portion extending from the second point to a front end of the second lead;
    a third lead having a third portion that is a substantially flat portion including a front end of the third lead and extending along a direction which crosses an extending direction of the first portion of the first lead and the second portion of the second lead;
    a fourth lead having a fourth portion that is a substantially flat portion including a front end of the fourth lead and extending along a direction which crosses the extending direction of the first portion of the first lead and the second portion of the second lead;
    a first electronic part mounted at the first portion of the first lead and the second portion of the second lead; and
    a second electronic part mounted at the third portion of the third lead and the fourth portion of the fourth lead,
    wherein at least one of a first distance from the first point to the front end of the first lead and a second distance from the second point to the front end of the second lead is longer than any of a distance from the first point to the second electronic part and a distance from the second point to the second electronic part, and
    wherein a first plane including the first portion of the first lead and the second portion of the second lead and a second plane including the third portion of the third lead and the fourth portion of the fourth lead cross each other.

2. The electronic device of claim 1, wherein the first electronic part is disposed on the first portion of the first lead and the second portion of the second lead.

3. The electronic device of claim 1, further comprising:
    a fifth lead bent at a fifth point and having a fifth portion that is a substantially flat portion extending from the fifth point to a front end of the fifth lead;
    a sixth lead bent at a sixth point and having a sixth portion that is a substantially flat portion extending from the sixth point to a front end of the sixth lead; and
    a third electronic part mounted at the fifth portion of the fifth lead and the sixth portion of the sixth lead,
    wherein at least one of a fifth distance from the fifth point to the front end of the fifth lead and a sixth distance from the sixth point to the front end of the sixth lead is longer than any of a distance from the fifth point to the second electronic part and a distance from the sixth point to the second electronic part, and
    wherein a third plane including the fifth portion of the fifth lead and the sixth portion of the sixth lead crosses both of the first plane and the second plane.

4. The electronic device of claim 1, wherein the first electronic part and the second electronic part are gyro sensors.

5. The electronic device of claim 4, wherein the gyro sensors are made of quartz crystal.

6. The electronic device of claim 1, wherein the first lead is bent at a 90 degree angle.

7. The electronic device of claim 1, wherein the first electronic part and the second electronic part do not overlap in a plane view.

8. The electronic device of claim 3, wherein the third electronic part does not overlap with any of the first electronic part and the second electronic part in a plane view.

* * * * *